US012804998B2

(12) United States Patent
Chang et al.

(10) Patent No.: US 12,804,998 B2
(45) Date of Patent: Nov. 17, 2026

(54) HIGH-K DIELECTRIC MATERIALS WITH DIPOLE LAYER

(71) Applicant: Taiwan Semiconductor Manufacturing Company, Ltd., Hsinchu (TW)

(72) Inventors: Huiching Chang, Hsinchu (TW); I-Ming Chang, Hsinchu (TW); Huang-Lin Chao, Hillsboro, OR (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/447,239

(22) Filed: Aug. 9, 2023

(65) Prior Publication Data

US 2023/0386938 A1 Nov. 30, 2023

Related U.S. Application Data

(62) Division of application No. 17/534,377, filed on Nov. 23, 2021, now Pat. No. 12,557,368.
(Continued)

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/024* (2025.01); *H10D 30/031* (2025.01);
(Continued)

(58) Field of Classification Search
CPC ....... H01L 21/02192; H01L 21/823842; H01L 27/088; H01L 29/0847; H10D 30/024;
(Continued)

(56) References Cited

U.S. PATENT DOCUMENTS

| | | | | |
|---|---|---|---|---|
| 2012/0080760 A1* | 4/2012 | Chang | H10D 30/021 | 257/E21.441 |
| 2013/0316546 A1* | 11/2013 | Tong | H01L 21/0228 | 438/785 |

(Continued)

OTHER PUBLICATIONS

Osten, "High-k gate dielectrics with ultra-low leakage current based on praseodymium oxide", Dec. 13, 2000, International Electron Devices Meeting 2000, Technical Digest (Year: 2000).*
(Continued)

*Primary Examiner* — Matthew C Landau
*Assistant Examiner* — Halee Cramer
(74) *Attorney, Agent, or Firm* — Kilpatrick Townsend & Stockton LLP

(57) ABSTRACT

A method of forming a semiconductor device includes forming a transistor comprising a gate stack on a semiconductor substrate by, at least, forming a first dielectric layer on the semiconductor substrate, forming a dipole layer on the dielectric layer; forming a second dielectric layer on the dipole layer, forming a conductive work function layer on the second dielectric layer, forming a gate electrode layer on the conductive work function layer. The method also includes varying a distance between dipole inducing elements in the dipole layer and a surface of the semiconductor substrate by tuning a thickness of the first dielectric layer to adjust a threshold voltage of the transistor.

20 Claims, 30 Drawing Sheets

Related U.S. Application Data

(60) Provisional application No. 63/166,865, filed on Mar. 26, 2021.

(51) Int. Cl.

| | |
|---|---|
| ***H10D 30/62*** | (2025.01) |
| ***H10D 30/67*** | (2025.01) |
| ***H10D 30/69*** | (2025.01) |
| ***H10D 62/10*** | (2025.01) |
| ***H10D 64/01*** | (2025.01) |
| ***H10D 64/68*** | (2025.01) |
| ***H10D 84/01*** | (2025.01) |
| ***H10D 84/85*** | (2025.01) |
| ***H10P 14/20*** | (2026.01) |
| ***H10P 14/60*** | (2026.01) |
| ***H10P 14/692*** | (2026.01) |

(52) U.S. Cl.

CPC ..... *H10D 30/0415* (2025.01); *H10D 30/6211* (2025.01); *H10D 30/6735* (2025.01); *H10D 30/6739* (2025.01); *H10D 30/6757* (2025.01); *H10D 30/701* (2025.01); *H10D 62/118* (2025.01); *H10D 64/01318* (2026.01); *H10D 64/017* (2025.01); *H10D 64/689* (2025.01); *H10D 84/0167* (2025.01); *H10D 84/0177* (2025.01); *H10D 84/0181* (2025.01); *H10D 84/0186* (2025.01); *H10D 84/0193* (2025.01); *H10D 84/853* (2025.01); *H10P 14/3452* (2026.01); *H10P 14/6339* (2026.01); *H10P 14/69396* (2026.01)

(58) Field of Classification Search

CPC .. H10D 30/031; H10D 84/038; H10D 64/691; H10D 64/0134

See application file for complete search history.

(56) References Cited

U.S. PATENT DOCUMENTS

| | | | | |
|---|---|---|---|---|
| 2014/0138795 | A1* | 5/2014 | Ahn | C23C 16/308 257/532 |
| 2015/0187763 | A1* | 7/2015 | Kim | H10D 64/693 257/368 |
| 2017/0323949 | A1 | 11/2017 | Loubet et al. | |
| 2019/0131185 | A1* | 5/2019 | Huang | H10D 84/038 |
| 2020/0091278 | A1 | 3/2020 | Jung et al. | |
| 2020/0119019 | A1* | 4/2020 | Tsai | H10D 62/151 |
| 2020/0194430 | A1 | 6/2020 | Liang et al. | |

OTHER PUBLICATIONS

H.J. Osten, J. P. Liu, P. Gaworzewski, E. Bugiel and P. Zaumseil, “High-k gate dielectrics with ultra-low leakage current based on praseodymium oxide,” International Electron Devices Meeting 2000. Technical Digest. IEDM; pp. 653-656 (Year: 2000).

* cited by examiner

HIGH-K DIELECTRIC MATERIALS WITH DIPOLE LAYER

CROSS-REFERENCES TO RELATED APPLICATIONS

The present application is a divisional application of U.S. patent application Ser. No. 17/534,377, filed Nov. 23, 2021, which claims priority to U.S. Provisional Patent Application No. 63/166,865, filed Mar. 26, 2021, the entire disclosure of which is incorporated herein by reference.

TECHNICAL FIELD

The subject matter described herein relates to transistor gates, and more particularly to transistor gates having a dipole and dielectric layers.

BACKGROUND

Semiconductor devices are used in a variety of electronic applications, such as personal computers, cell phones, digital cameras, storage devices, and other electronic equipment. Semiconductor devices are generally fabricated by sequentially forming dielectric layers, conductive layers, semiconductor layers, and other material layers over a semiconductor substrate. As the semiconductor industry continues to scale down the thicknesses of the various layers to increase the performance and integration density of semiconductor devices, leakage current increases due to the thinning of gate dielectric layers.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
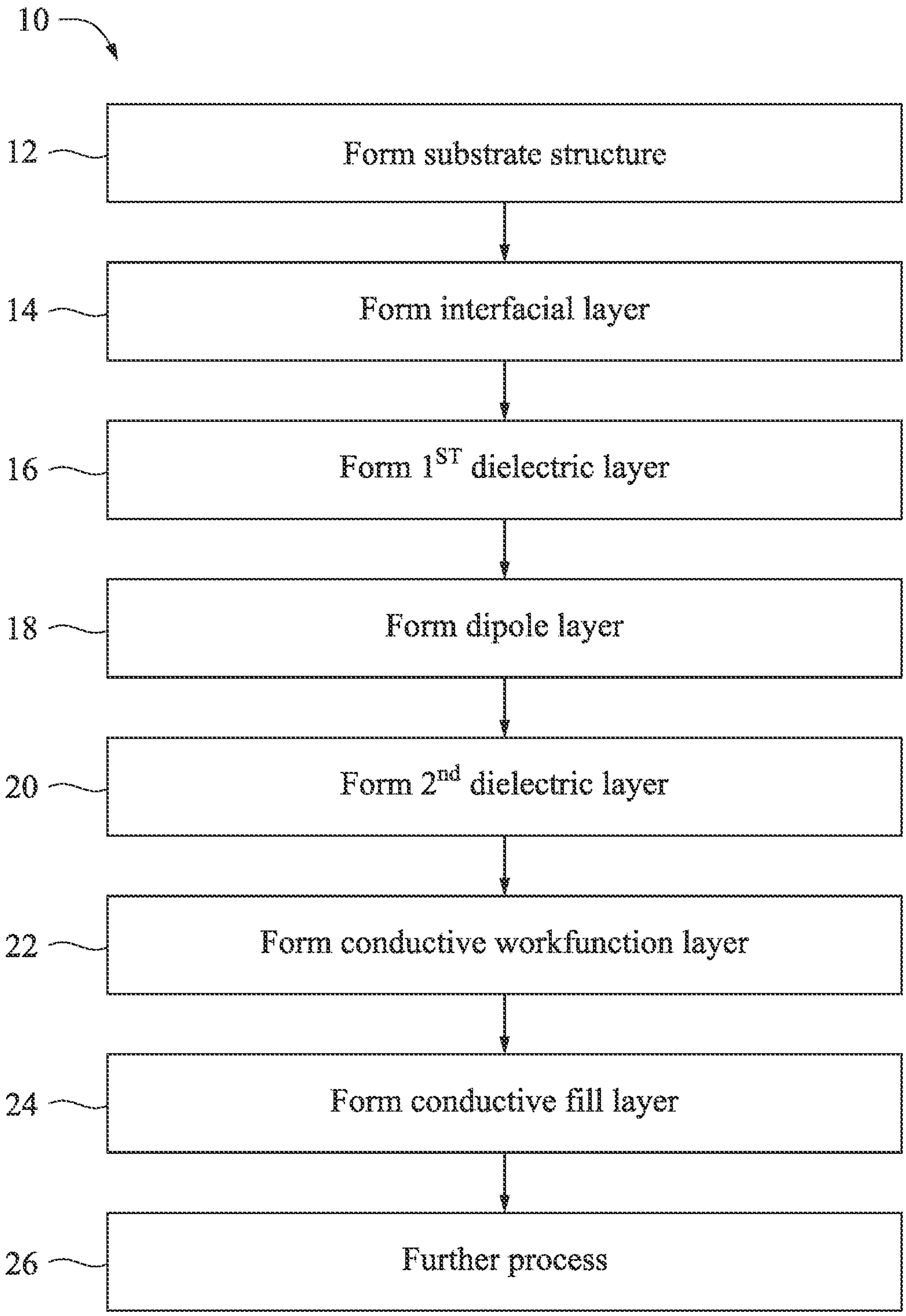
FIG. 1 is a flow diagram illustrating a process of manufacturing a semiconductor device in accordance with some embodiments.

The following detailed description provides many different embodiments or examples to facilitate the understanding of devices and method recited in the claims. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Scaling down the thickness of various layers increase the performance and integration density of semiconductor devices. However, thinning dielectric layers causes an increase in leakage current due to directly tunneling between the dielectric layers and the substrate. To prevent increase in leakage current, a gate dielectric is replaced by a high-k material that has a dielectric constant larger than the dielectric constant of $SiO_2$, which has a dielectric constant value of about 3.9. An interface between a conductive layer and a high-k material layer causes an increase in the threshold voltage of a transistor device. As used herein, the term “high-k material” or “high-k dielectric” may refer to a dielectric layer having a dielectric constant greater than 15.

As illustration, high-k materials such as hafnium oxides or zirconium oxides with a dielectric constant of about 20 to 25 have poor thermal stability and undergo a phase change at temperature greater than 800 degrees C. Other dielectric materials have better thermal stability at the expense of lower dielectric constant.

As used herein, the term “high-k” may refer to a dielectric constant k that is higher than the dielectric constant of silicon dioxide. High-k materials typically have a lower equivalent oxide thickness than $SiO_2$ so they could retain an appropriate gate oxide thickness to prevent leakage current while also increasing the switching speed. High-k materials allow reducing leakage while keeping a very low electrical equivalent oxide thickness. Hence, efforts to realize interconnects using low-k dielectric and low leakage gate oxide employing high-k dielectric for shrinking sizes of semiconductor devices have been made.

Numerous benefits and advantages are achieved by way of the present disclosure over conventional techniques. For example, embodiments of the present disclosure provide a stack of gate dielectric layers including a first dielectric layer containing praseodymium (Pr) and oxygen (O) and a second dielectric layer containing aluminum and oxygen on the first dielectric layer. The aluminum atoms of the second dielectric layer are diffused into the first dielectric layer to form a dipole that controls the threshold voltage of a transistor device. Furthermore, because the first dielectric layer has a dielectric constant value in a range of about 25 to about 32, which is much larger than the $SiO_2$ dielectric constant value, the physical thickness of the first dielectric layer can be substantially thicker than a layer having $SiO_2$ to overcome issues of high leakage current while having an equivalent oxide thickness (EOT) value smaller than that of the layer having $SiO_2$. As used herein, the term "equivalent oxide thickness (EOT)" is also referred to as "capacitance equivalent thickness (CET)." Moreover, the first dielectric layer can sustain high anneal temperature without reacting with silicon and changing its properties. Additionally, the embodiments include a high-k dielectric layer disposed on the second dielectric layer to prevent a work function of a gate stack from being affected from subsequent processes. These and other embodiments of the disclosure, along with many of its advantages and features, are described in more detail in conjunction with the text below and corresponding figures.

Some embodiments presented herein provide materials and techniques which produce transistors, such as FinFETs and GAA FETs, with tunable threshold voltages using a dipole layer formed on a high-k dielectric layer. The high-k dielectric layer is formed on an interfacial layer and contains praseodymium (Pr) and oxygen. In some embodiments, an example of the high-k dielectric layer containing praseodymium (Pr) and oxygen is the praseodymium oxide layer, which has a composition of $Pr_xO_y$, where x is between about 0.1 and about 2, and where y is between about 0.1 and about 3, for example, $Pr_2O_3$. The praseodymium oxide layer exhibits a leakage current density that is lower than a leakage current density of $HfO_2$ and $ZrO_2$ at an EOT of about 1.4 nm. For example, the high-k dielectric layer contains praseodymium and oxygen has a leakage current density lower than $10^{-8}$ A/cm$^2$ at a gate voltage of +/−1V. Therefore, a thinner layer of the high-k dielectric layer contains praseodymium oxide can be used in the device, as compared with $HfO_2$ and $ZrO_2$. As a result, the EOT or CET can be lower in devices using the high-k dielectric layer contains praseodymium (Pr) and oxygen. Further, the praseodymium oxide has a dielectric constant value in a range of about 25 to about 32, whereas $HfO_2$ has a dielectric constant value in a range of about 5 to about 17. Therefore, using praseodymium oxide can further reduce the EOT of the device. The low leakage current and high dielectric constant of the praseodymium oxide enables the device to achieve a low EOT even with the dipole layer retained in the device.

Some embodiments presented herein provide materials and techniques which produce transistors, such as FinFETs and GAA FETs, with tunable threshold voltages using a dipole formed at a location of a high-k dielectric layer. The high-k dielectric layer is formed on an interfacial layer and contains praseodymium (Pr) and oxygen that exhibits a leakage current density that is lower than a leakage current density of $HfO_2$ and $ZrO_2$ at an EOT of about 1.4 nm. For example, the high-k dielectric layer contains praseodymium and oxygen has a leakage current density lower than $10^{-8}$ A/cm$^2$ at a gate voltage of +/−1V. Therefore, a thinner layer of the high-k dielectric layer contains praseodymium (Pr) and oxygen, such as $Pr_2O_3$, can be used in the device, as compared with $HfO_2$ and $ZrO_2$. As a result, the EOT or CET can be lower in devices using the high-k dielectric layer contains praseodymium (Pr) and oxygen.

Some embodiments are described in the context of FinFETs. The fins of FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Implementations of some aspects may be used in other devices. For example, other devices include Horizontal Gate All Around (HGAA) FETs, Vertical Gate All Around (VGAA) FETs, nanowire channel FETs, and other devices, for example, such as those including nanosheet structures.

A person having ordinary skill in the art will readily understand that implementations of some or all aspects may be used in certain or any other transistor structures.

Figure 2:
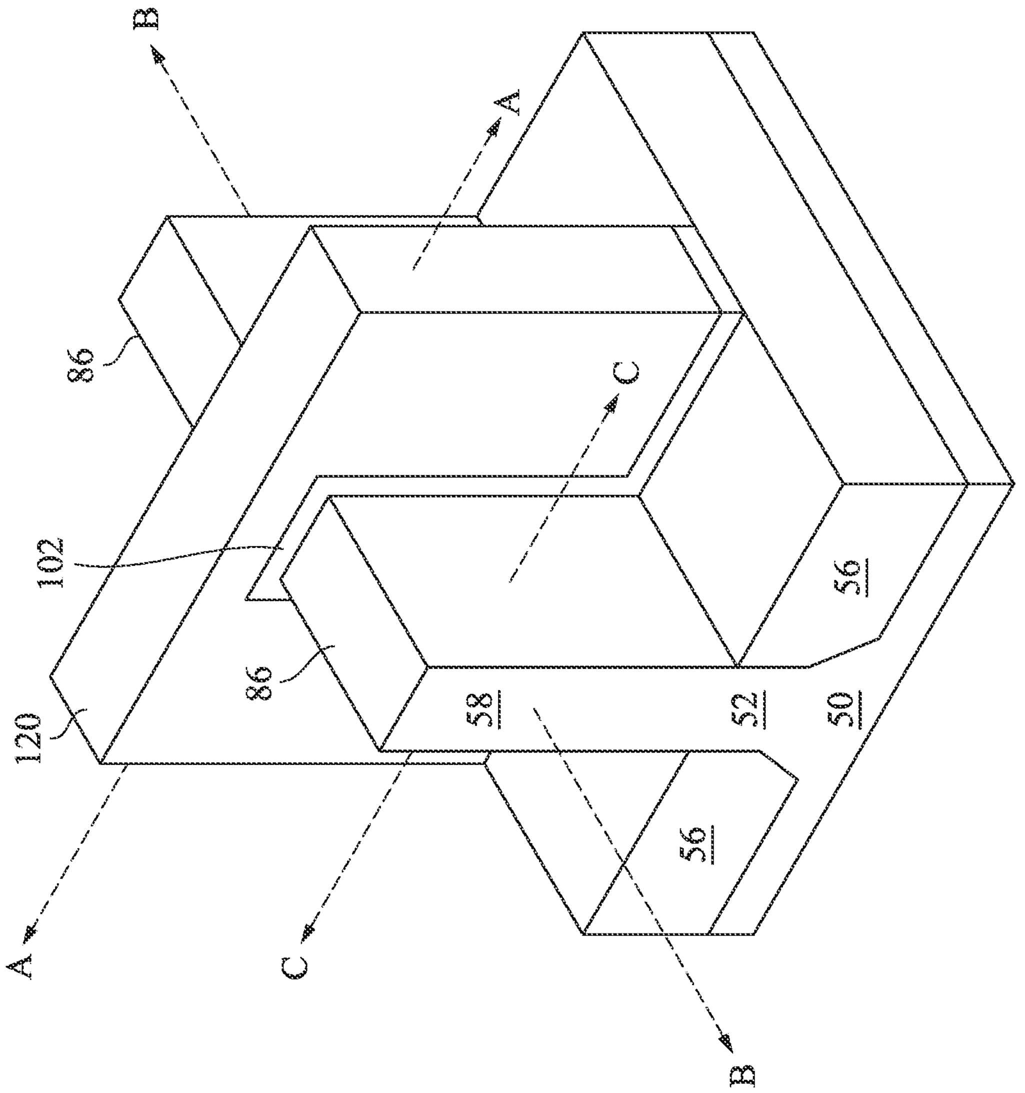
FIG. 2 is a schematic perspective view of a semiconductor substrate at one stage of manufacturing a semiconductor device in accordance with some embodiments.

FIG. 1 depicts an exemplary flow diagram of a process 10 performed to form a gate structure, such as described with respect to FIG. 2 to FIG. 20. FIG. 2 is a schematic perspective view and FIG. 3 to FIG. 20 are schematic cross-sectional views of portions of the substrate illustrating gate stacks of transistors corresponding to various stages of the process 10 in accordance with some embodiments. The process 10 may be utilized to form any suitable structures.

FIG. 2 illustrates an example of a FinFET which can be formed using the process 10 of FIG. 1, in accordance with some embodiments. The FinFET is illustrated in a three-dimensional view, and comprises a fin 58 on a substrate 50. Isolation regions 56 are formed on the substrate 50, and the fin 58 protrudes above and from between neighboring isolation regions 56. A first gate dielectric layer 102 is along sidewalls and over a top surface of the fin 58, and a gate electrode 120 is over the first gate dielectric layer 102. Source/drain regions 86 are disposed in opposite sides of the fin 58 with respect to the first gate dielectric layer 102 and gate electrode 120. FIG. 2 further illustrates reference cross-sections that are used in later figures. Cross-section A-A is across a channel, first gate dielectric layer 102, and gate electrode 120 of the FinFET. Cross-section B-B is perpendicular to cross-section A-A and is along a longitudinal axis of the fin 58 and in a direction of, for example, a current flow between the source/drain regions 86. Cross-section C-C is parallel to cross-section B-B and extends through a source/drain region of the FinFET Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 3-20 are cross-sectional views of intermediate stages in the manufacturing of FinFETs, in accordance with some embodiments of process 10 of FIG. 1. FIGS. 3 through 7 illustrate multiple FinFETs each shown along reference cross-section A-A illustrated in FIG. 2. FIGS. 8 through 10A, and 11-20 illustrate multiple FinFETs each shown along reference cross-section B-B illustrated in FIG. 2. FIGS. 10B and 10C illustrate multiple FinFETs each shown along reference cross-section C-C illustrated in FIG. 2.

Figure 3:
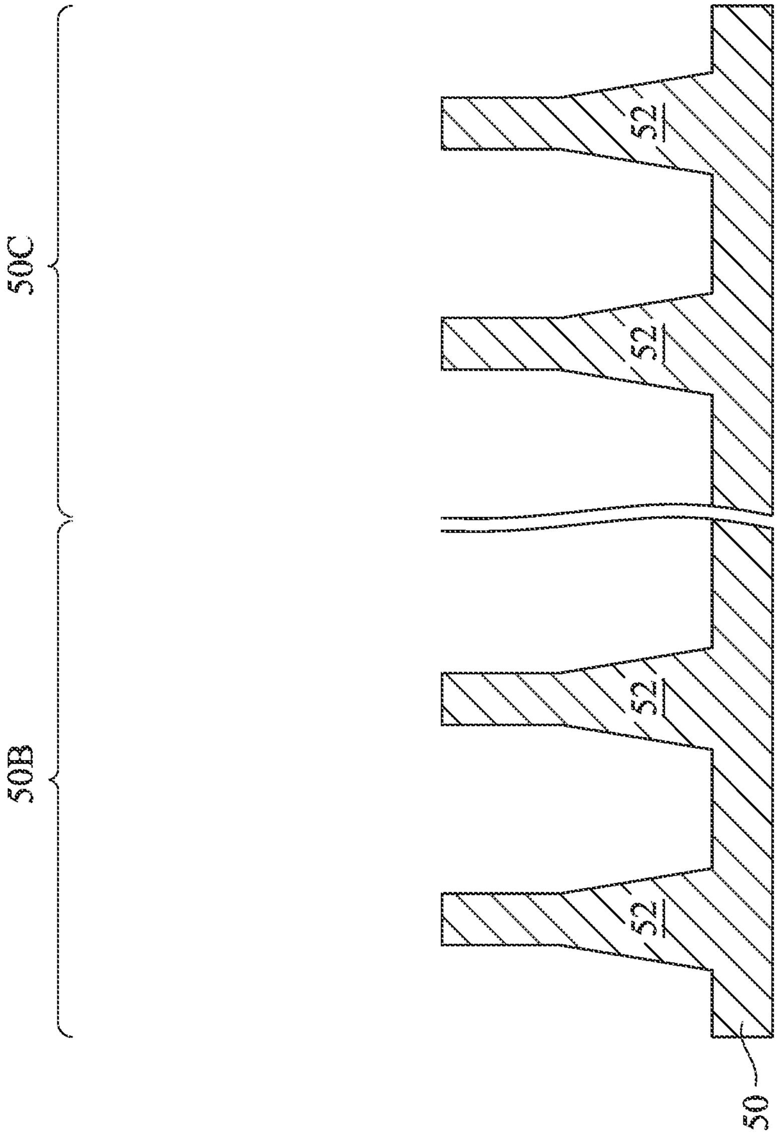
FIGS. 3-20 are schematic cross-section views of a semiconductor substrate at various stages of manufacturing a high-k metal gate structure in accordance with some embodiments.

At operation 12 of the process 10 of FIG. 1, fin structures are formed in a substrate 50, as shown in FIG. 3. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs or p-type devices, such as PMOS transistors, e.g., p-type FinFETs having first threshold adjustment. The region 50C can be for forming n-type devices, such as NMOS transistors, e.g., n-type FinFETs or p-type devices, such as PMOS transistors, e.g., p-type FinFETs having a second, different threshold adjustment. The first region 50B may be physically separated from the region 50C (as illustrated by a divider), and any number of device features (e.g., other active devices, doped regions, isolation structures, etc.) may be disposed between the first region 50B and the region 50C. In some embodiments, both the first region 50B and the region 50C are used to form the same type of devices, such as both regions being for n-type devices or p-type devices.

The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
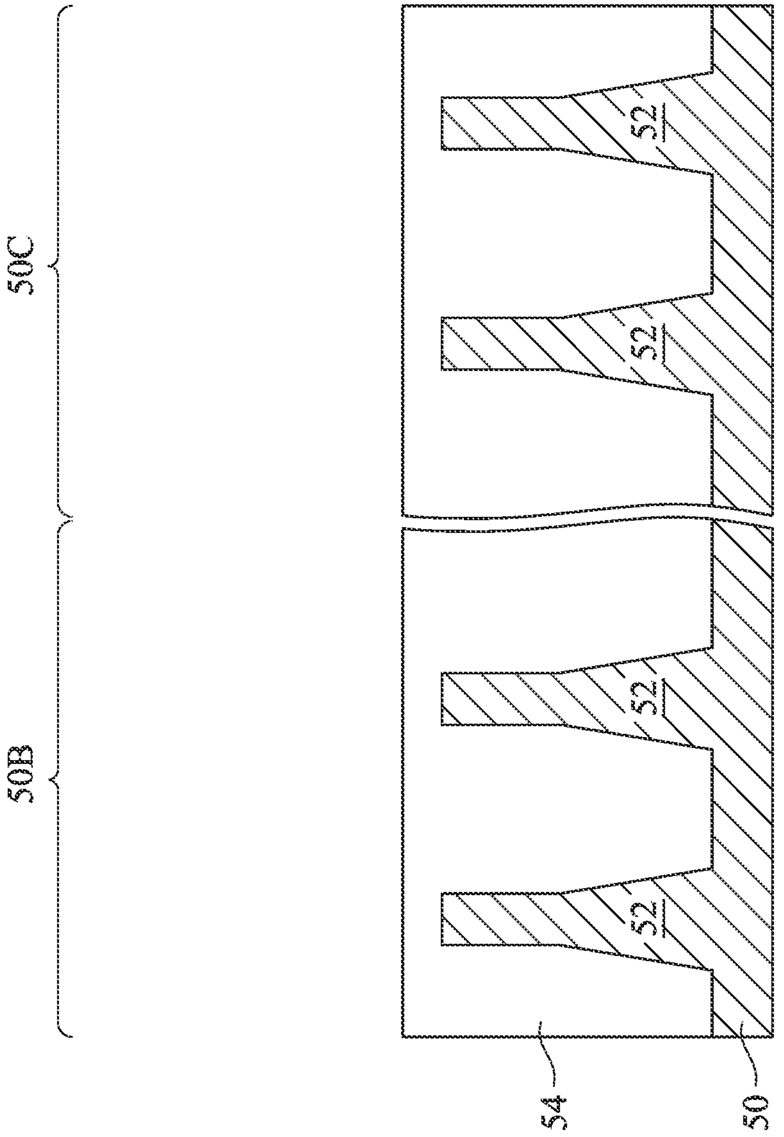

Also at operation 12 of the process 10 of FIG. 1, an insulation material 54 is formed over the substrate 50 and between neighboring fins 52, as shown in FIG. 4. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
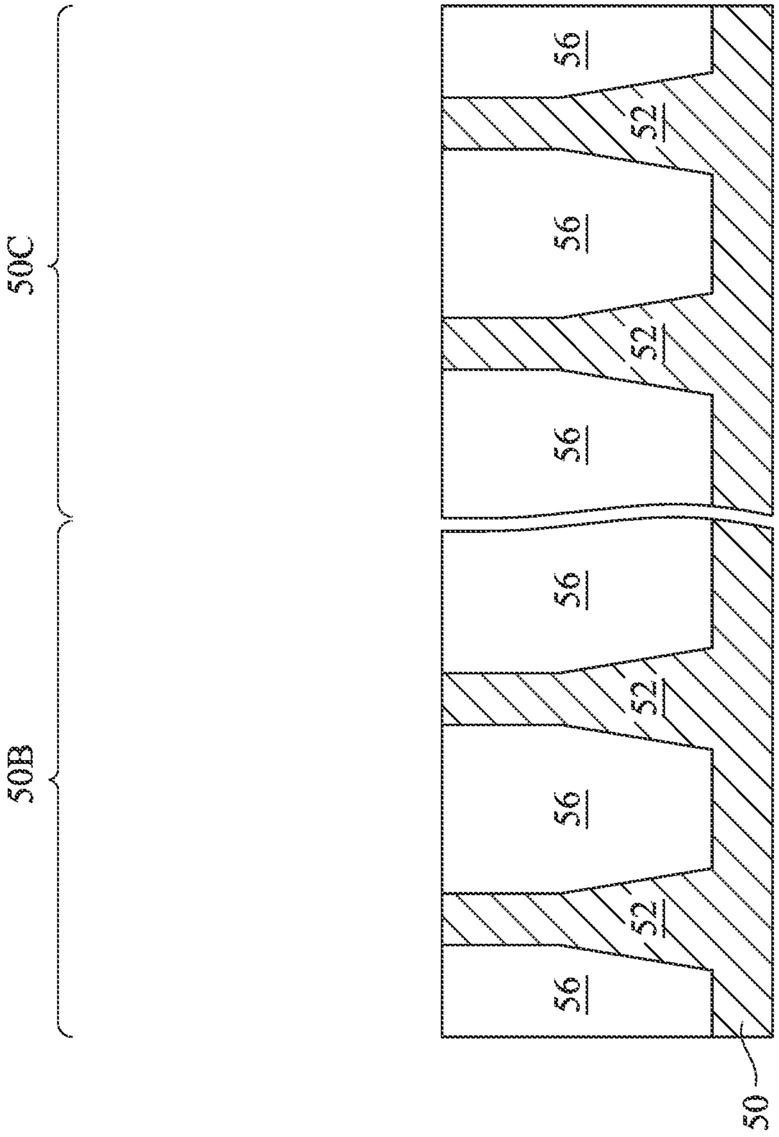

Also at operation 12 of the process 10 of FIG. 1, a planarization process is applied to the insulation material 54, as shown in FIG. 5. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 6:
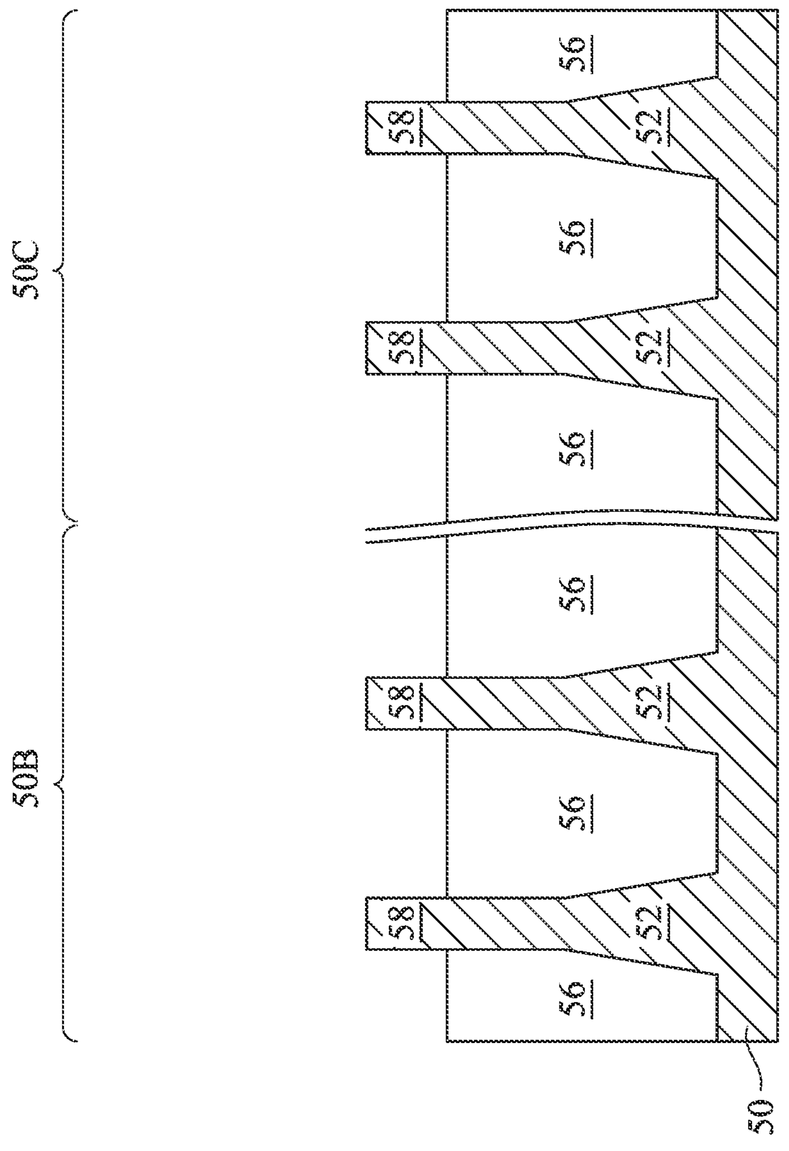

Also at operation 12 of the process 10 of FIG. 1, the insulation material 54 is recessed to form Shallow Trench Isolation (STI) regions 56, as shown in FIG. 6. The insulation material 54 is recessed such that fins 58 in the first region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 3 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium (SixGe1-x, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate doped regions (not shown, sometimes referred to as well regions) may be formed in the fins 58, the fins 52, and/or the substrate 50. In some embodiments, a P-type doped region may be formed in the first region 50B, and an N-type doped region may be formed in the region 50C. In some embodiments, only P-type or only N-type doped regions are formed in both the first region 50B and the region 50C.

In the embodiments with different types of doped regions, the different implant steps for the first region 50B and the region 50C may be achieved using a photoresist or other masks (not shown). For example, a photoresist may be formed over the fins 58 and the STI regions 56 in the first region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the first region 50B, such as an NMOS region. The n-type impurities may be phosphorus, arsenic, or the like implanted in the region to a concentration of equal to or less than 1018 cm-3, such as from about 1017 cm-3 to about 1018 cm-3. After the implant, the photoresist is removed, such as by an acceptable ashing process. Following the implanting of the region 50C, a photoresist is formed over the fins 58 and the STI regions 56 in the region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the region 50C, such as the PMOS region. The p-type impurities may be boron, BF2, or the like implanted in the region to a concentration of equal to or less than 1018 cm-3, such as from about 1017 cm-3 to about 1018 cm-3. After the implant, the photoresist may be removed, such as by an acceptable ashing process. After the implants of the first region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
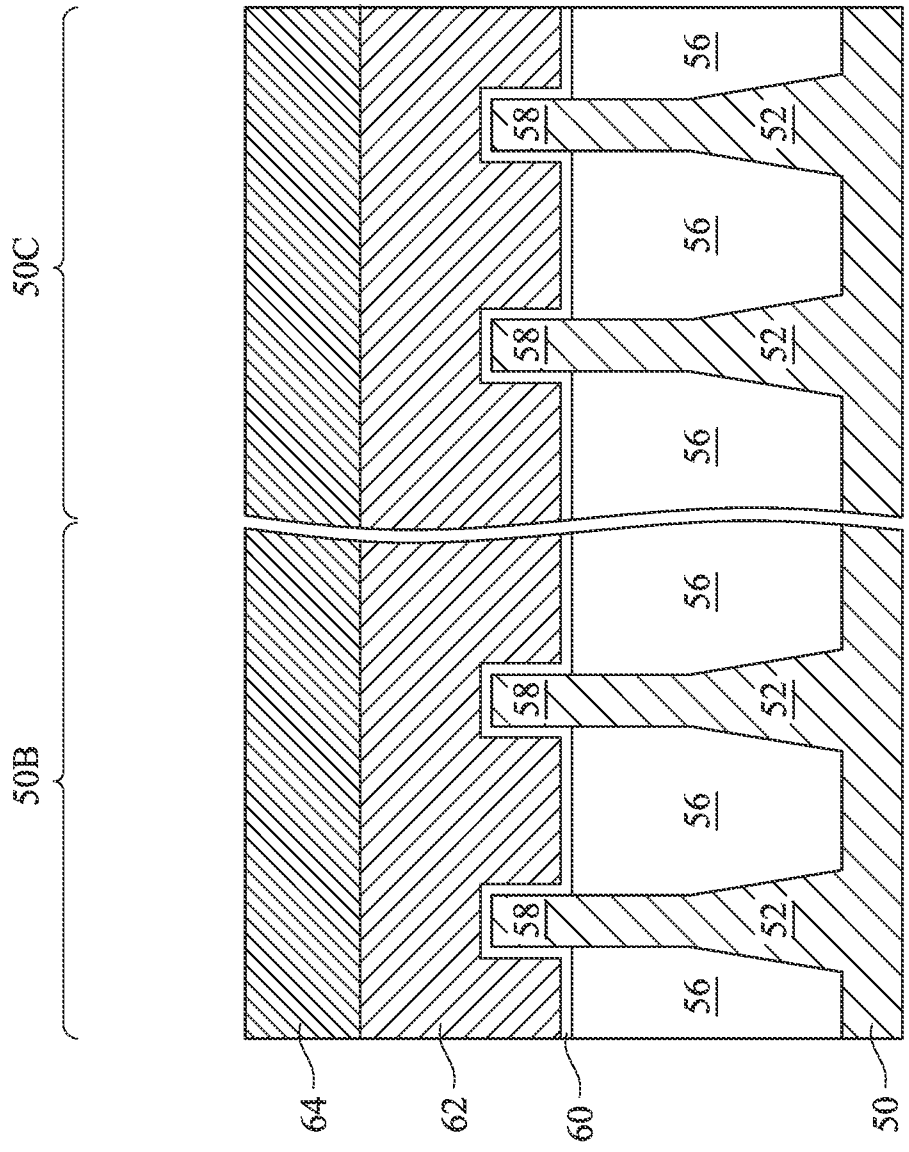

Also at operation 12 of the process 10 of FIG. 1, a dummy dielectric layer 60 is formed over the fins 58, as shown in FIG. 7. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may be deposited over the dummy gate layer 62. The mask layer 64 may include, for example, SiN, SiON, or the like. In this example, a single dummy gate layer 62 and a single mask layer 64 are formed across the first region 50B and the region 50C. In some embodiments, separate dummy gate layers may be formed in the first region 50B and the region 50C, and separate mask layers may be formed in the first region 50B and the region 50C.

FIGS. 8-20 are cross-sectional views of intermediate stages in the manufacturing of FinFETs, in accordance with some embodiments. FIGS. 8-10A and 11-20 are shown along reference cross-section B-B illustrated in FIG. 1, except for multiple fins/FinFETs. FIGS. 10B-10C are shown along reference cross-section C-C illustrated in FIG. 1, except for multiple fins/FinFETs.

FIGS. 8-20 illustrate a first region 58B and a second region 58C of one or more of the fins 58. The regions 58B and 58C may be in the same fin 58 or different fins 58. Devices in the different regions 58B and 58C are formed to have different conductivity types.

Figure 8:
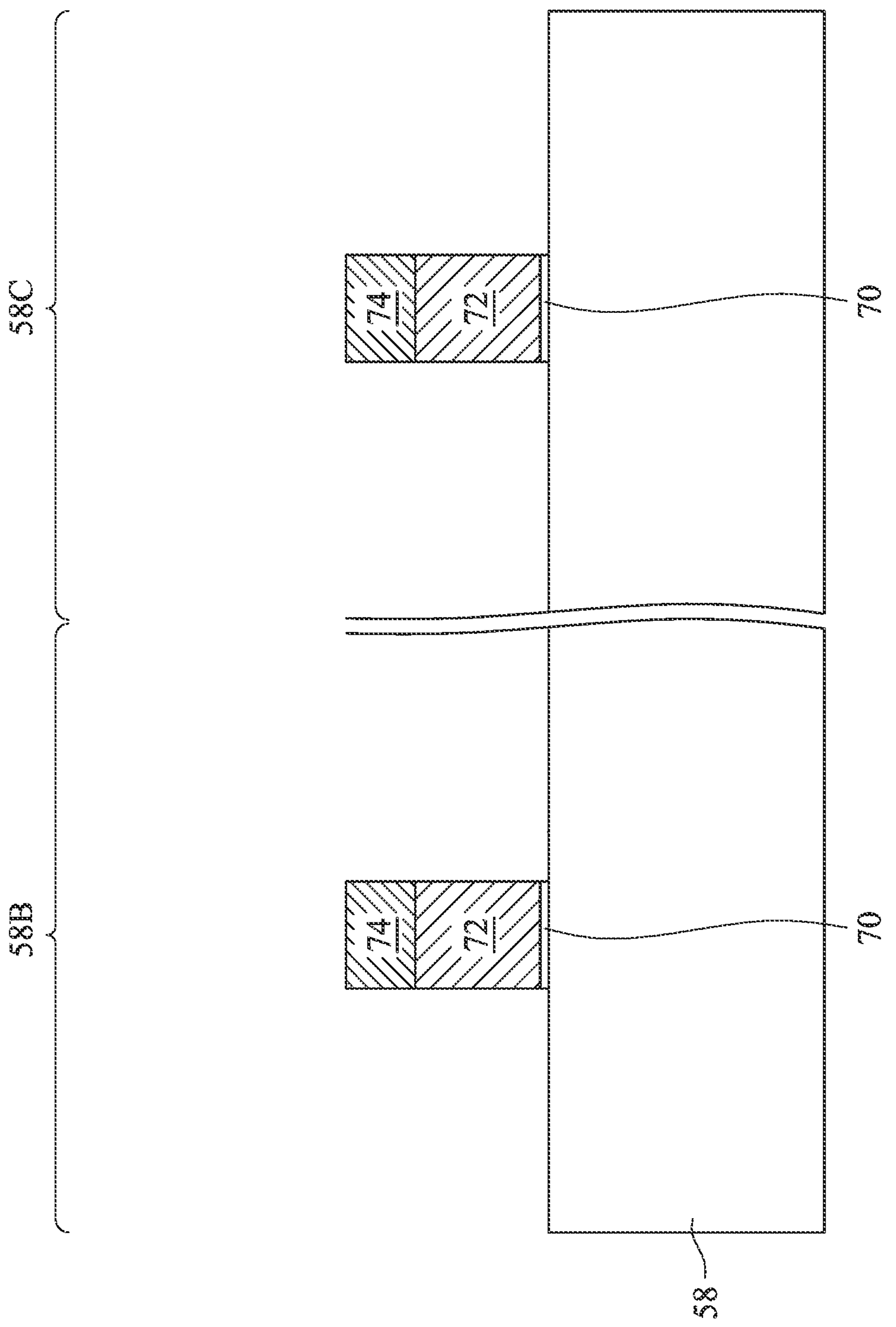

Also at operation 12 of the process 10 of FIG. 1, the mask layer 64 is patterned using acceptable photolithography and etching techniques to form masks 74, as shown in FIG. 8. The pattern of the masks 74 then may be transferred to the dummy gate layer 62 and the dummy dielectric layer 60 by an acceptable etching technique to, respectively, form dummy gates 72 and dummy gate dielectric layers 70. The dummy gates 72 and dummy gate dielectric layers 70 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Figure 9:
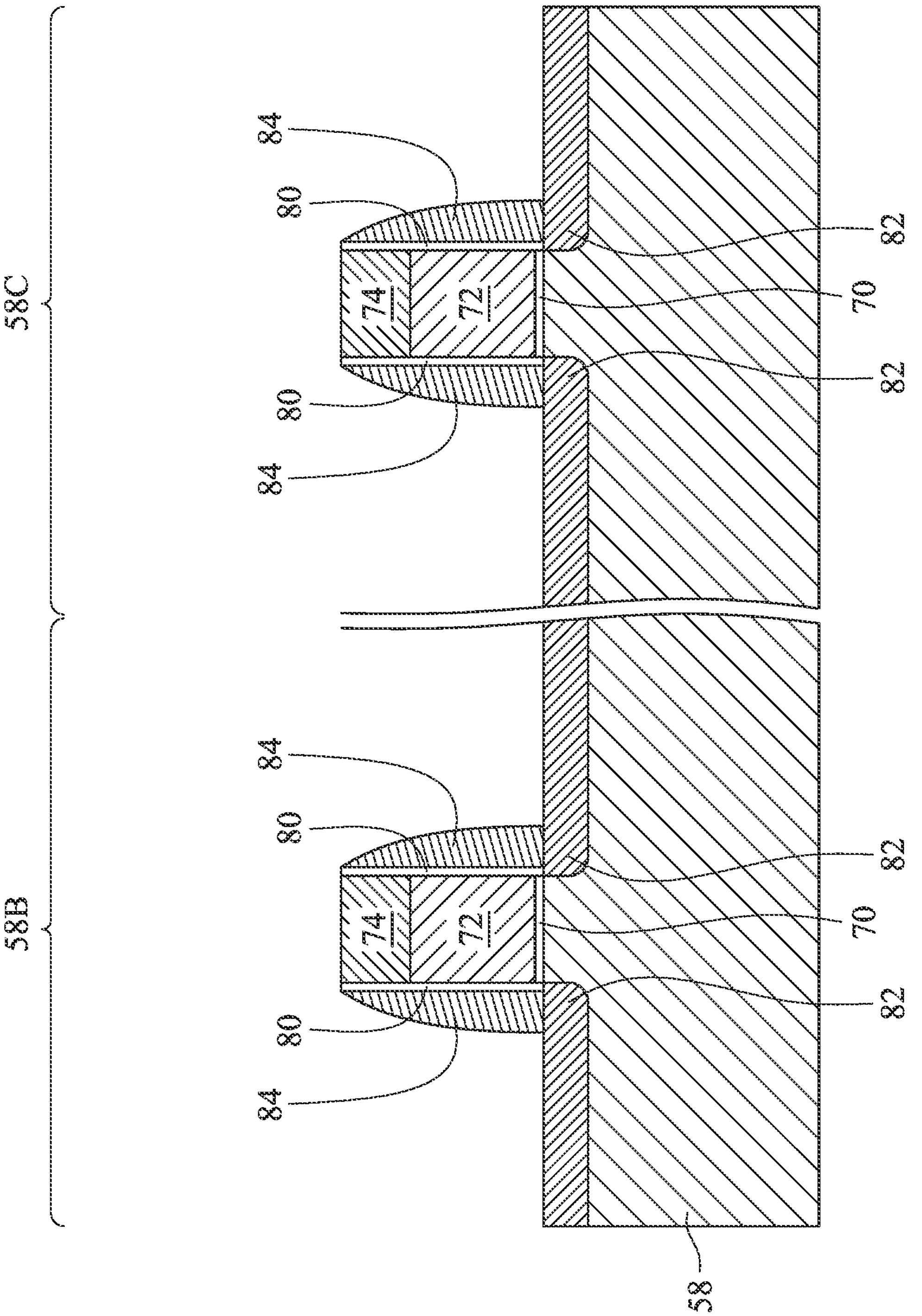

Also at operation 12 of the process 10 of FIG. 1, gate seal spacers 80 can be formed on exposed surfaces of the dummy gates 72 and/or the fins 58, as shown in FIG. 9. A thermal oxidation or a deposition followed by an anisotropic etch may form the gate seal spacers 80. In some embodiments, the gate seal spacers 80 may be formed of a nitride, such as silicon nitride, silicon oxynitride, silicon carbide, silicon carbonitride, the like, or a combination thereof. The gate seal spacers 80 seal the sidewalls of subsequently formed gate stacks, and may act as additional gate spacing layers.

Further, implants for lightly doped source/drain (LDD) regions 82 may be performed. In the embodiments with different device types, similar to the implants discussed above in FIG. 6, a mask, such as a photoresist, may be formed over the first region 50B, while exposing the second region 50C, and appropriate type (e.g., n-type or p-type) impurities may be implanted into the exposed fins 58 in the second region 50C. The mask may then be removed. Subsequently, a mask, such as a photoresist, may be formed over the second region 50C while exposing the first region 50B, and appropriate type impurities may be implanted into the exposed fins 58 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about 1015 cm-3 to about 1016 cm-3. An anneal may be used to activate the implanted impurities.

Further, gate spacers 84 are formed on the gate seal spacers 80 along sidewalls of the dummy gates 72 and over the LDD regions 82. The gate spacers 84 may be formed by conformally depositing a material and subsequently anisotropically etching the material. The material of the gate spacers 84 may be silicon nitride, SiCN, a combination thereof, or the like. The etch may be selective to the material of the gate spacers 84, such that the LDD regions 82 are not etched during the formation of the gate spacers 84.

Figure 10A:
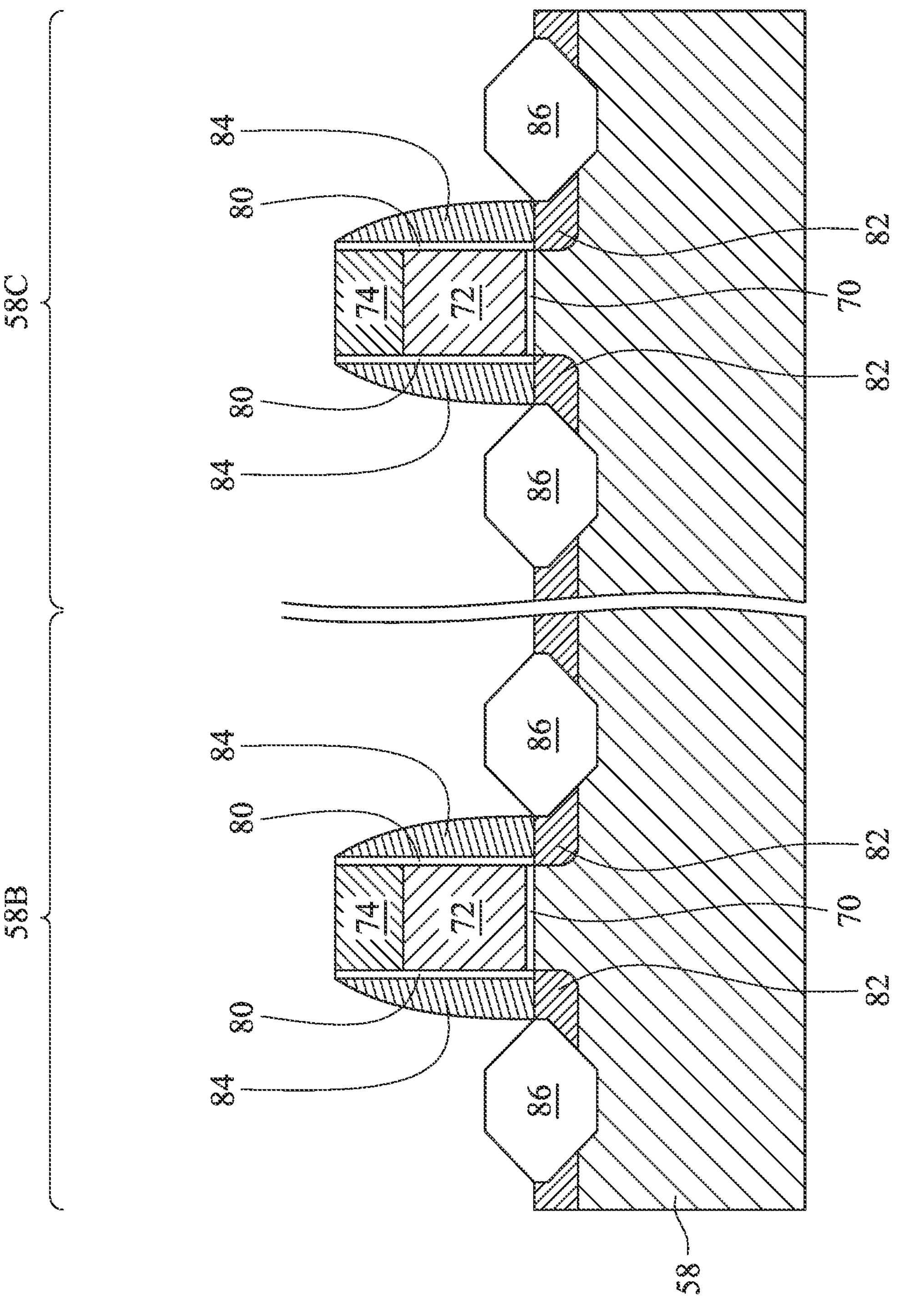
Figure 10C:
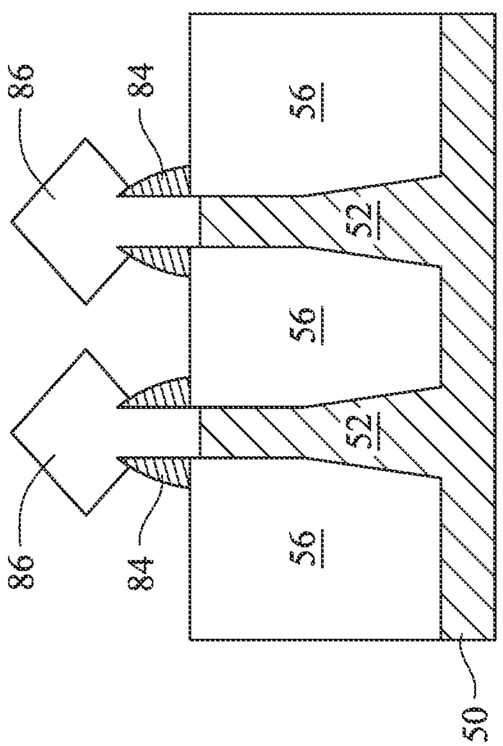
Figure 10B:
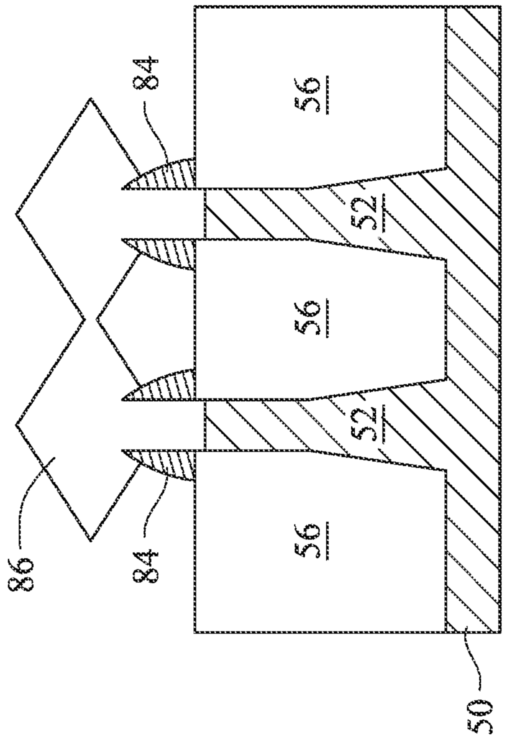

Also at operation 12 of the process 10 of FIG. 1, epitaxial source/drain regions 86 are formed in the fins 58, as shown in FIGS. 10A, 10B, and 10C. The epitaxial source/drain regions 86 are formed in the fins 58 such that each dummy gate 72 is disposed between respective neighboring pairs of the epitaxial source/drain regions 86. In some embodiments, the epitaxial source/drain regions 86 may extend through the LDD regions 82. In some embodiments, the gate seal spacers 80 and gate spacers 84 are used to separate the epitaxial source/drain regions 86 from the dummy gates 72 by an appropriate lateral distance so that the epitaxial source/drain regions 86 do not short out subsequently formed gates of the resulting FinFETs.

The epitaxial source/drain regions 86 in the region 50B, e.g., the NMOS region, may be formed by masking the second region 50C, e.g., the PMOS region, and etching source/drain regions of the fins 58 in the region 50B to form recesses in the fins 58. Then, the epitaxial source/drain regions 86 in the region 50B are epitaxially grown in the recesses. The epitaxial source/drain regions 86 may include any acceptable material, such as appropriate for n-type FinFETs. For example, if the fins 58 are silicon, the epitaxial source/drain regions 86 in the region 50B may include silicon, SiC, SiCP, SiP, or the like. The epitaxial source/drain regions 86 in the region 50B may have surfaces raised from respective surfaces of the fins 58 and may have facets.

The epitaxial source/drain regions 86 in the second region 50C, e.g., the PMOS region, may be formed by masking the region 50B, e.g., the NMOS region, and etching source/drain regions of the fins 58 in the second region 50C to form recesses in the fins 58. Then, the epitaxial source/drain regions 86 in the second region 50C are epitaxially grown in the recesses. The epitaxial source/drain regions 86 may include any acceptable material, such as appropriate for p-type FinFETs. For example, if the fins 58 are silicon, the epitaxial source/drain regions 86 in the second region 50C may comprise SiGe, SiGeB, Ge, GeSn, or the like. The epitaxial source/drain regions 86 in the second region 50C may also have surfaces raised from respective surfaces of the fins 58 and may have facets.

The epitaxial source/drain regions 86 are in situ doped during growth to form source/drain regions. The epitaxial source/drain regions 86 have the same doping type as the respective LDD regions 82, and may be doped with the same dopants or different dopants. The epitaxial source/drain regions 86 may have an impurity concentration of between about 1019 cm-3 and about 1021 cm-3. The n-type and/or p-type impurities for source/drain regions may be any of the impurities previously discussed. Because the epitaxial source/drain regions 86 are in situ doped during growth, they are not doped by implantation. However, the doping profile and concentration of the LDD regions 82 produced according to some embodiments may be similar to that which would be produced if the epitaxial source/drain regions 86 were doped by implantation. Improving the doping profile and concentration of the LDD regions 82 may improve the performance and reliability of the resulting semiconductor devices.

As a result of the epitaxy processes used to form the epitaxial source/drain regions 86 in the region 50B and the second region 50C, upper surfaces of the epitaxial source/drain regions have facets which expand laterally outward beyond a sidewalls of the fins 58. In some embodiments, these facets cause adjacent epitaxial source/drain regions 86 of a same finFET to merge, as illustrated by the embodiment of FIG. 10B. In other embodiments, adjacent epitaxial source/drain regions 86 remain separated after the epitaxy process is completed, as illustrated by the embodiment of FIG. 10C.

Figure 11:
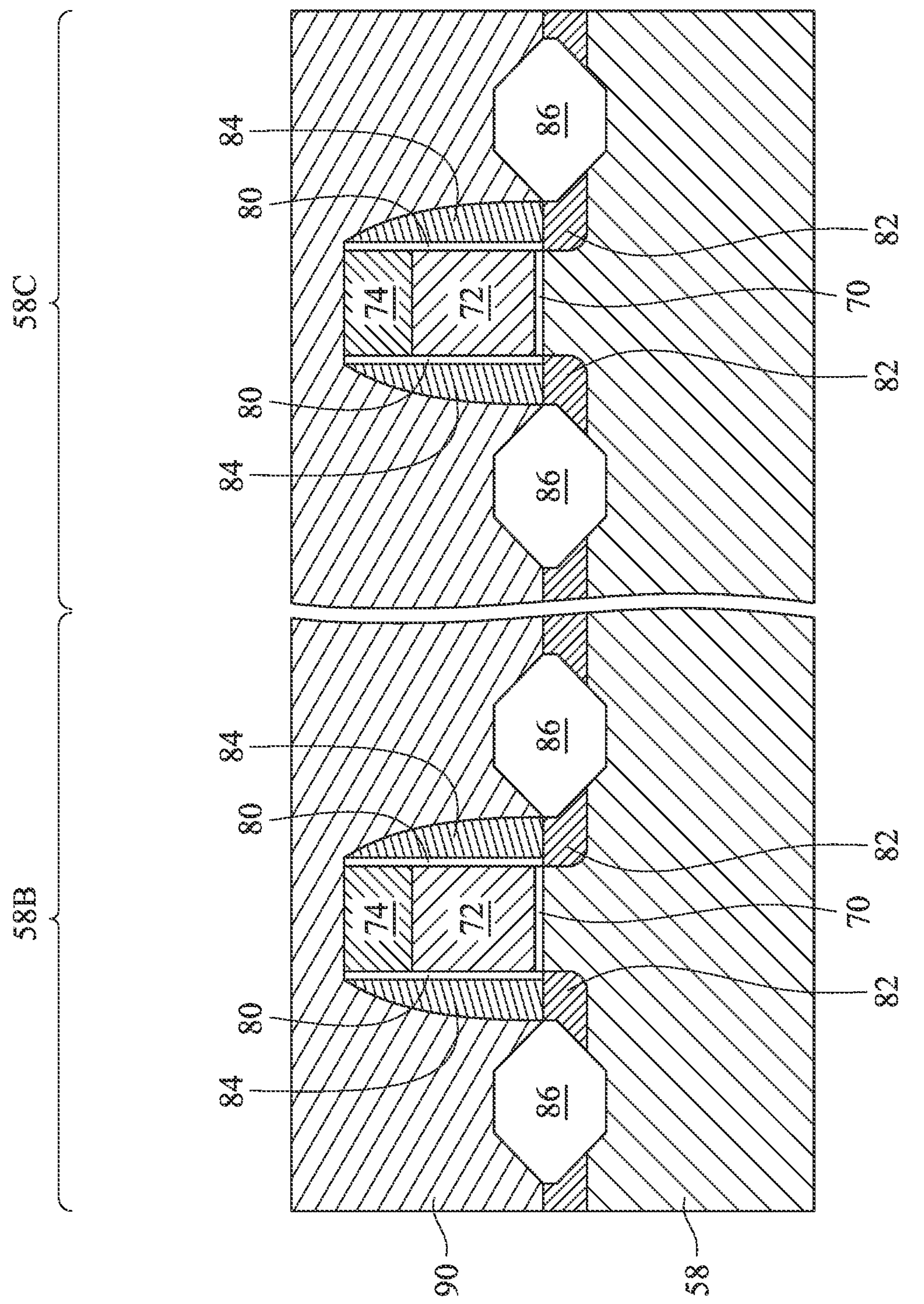

Also at operation 12 of the process 10 of FIG. 1, an ILD 90 is deposited over the fins 58, as shown in FIG. 11. The ILD 90 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium (SixGe1-x, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 90 and the epitaxial source/drain regions 86, the gate spacers 84, the gate seal spacers 80, and the masks 74.

Figure 12:
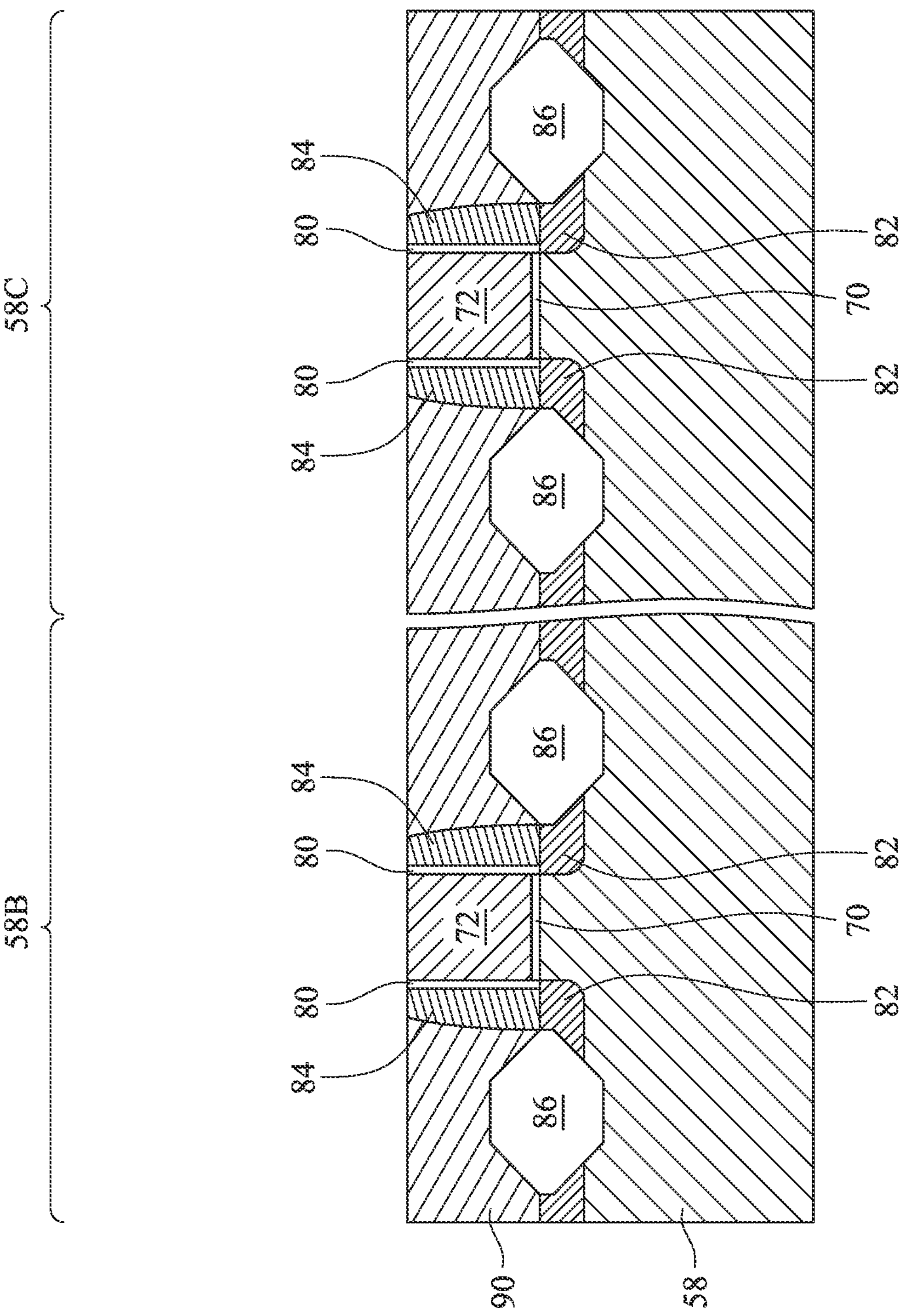

Also at operation 12 of the process 10 of FIG. 1, a planarization process, such as a CMP, may be performed to level the top surface of the ILD 90 with the top surfaces of the dummy gates 72, as shown in FIG. 12. The planarization process may also remove the masks 74 on the dummy gates 72, and portions of the gate seal spacers 80 and the gate spacers 84 along sidewalls of the masks 74. After the planarization process, top surfaces of the dummy gates 72, the gate seal spacers 80, the gate spacers 84, and the ILD 90 are level. Accordingly, the top surfaces of the dummy gates 72 are exposed through the ILD 90.

Figure 13:
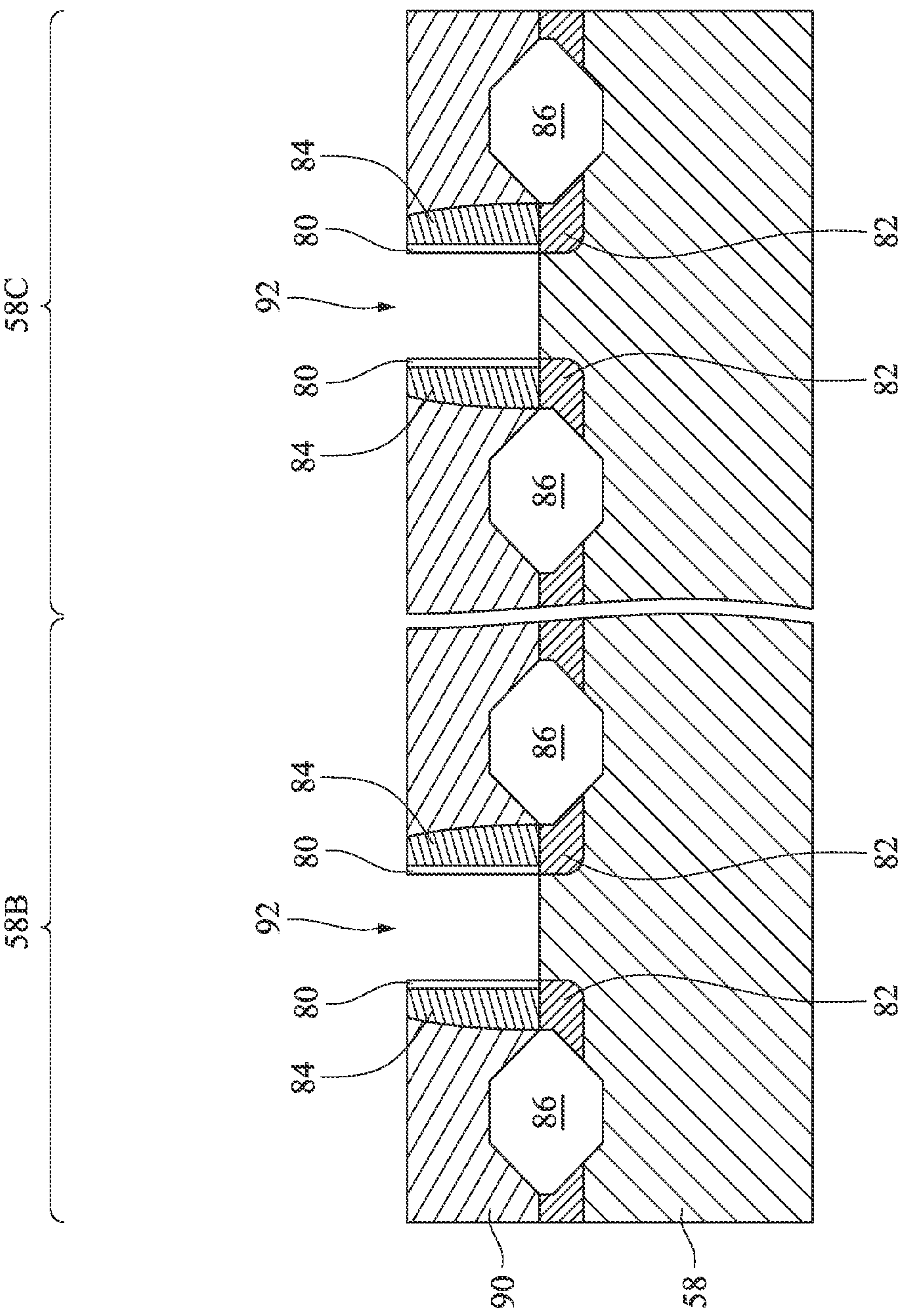

Also at operation 12 of the process 10 of FIG. 1, the dummy gates 72 and portions of the dummy gate dielectric layers 70 directly underlying the exposed dummy gates 72 are removed in an etching step(s), so that recesses 92 are formed, as shown in FIG. 13. In some embodiments, the dummy gates 72 are removed by an anisotropic dry etch process. For example, the etching process may include a dry etch process using reaction gas(es) that selectively etch the dummy gates 72 without etching the ILD 90, the gate spacers 84, or the gate seal spacers 80. Each recess 92 exposes a channel region of a respective fin 58. Each channel region is disposed between neighboring pairs of the epitaxial source/drain regions 86. During the removal, the dummy gate dielectric layers 70 may be used as an etch stop layer when the dummy gates 72 are etched. The dummy gate dielectric layers 70 may then be removed after the removal of the dummy gates 72.

Figure 14:
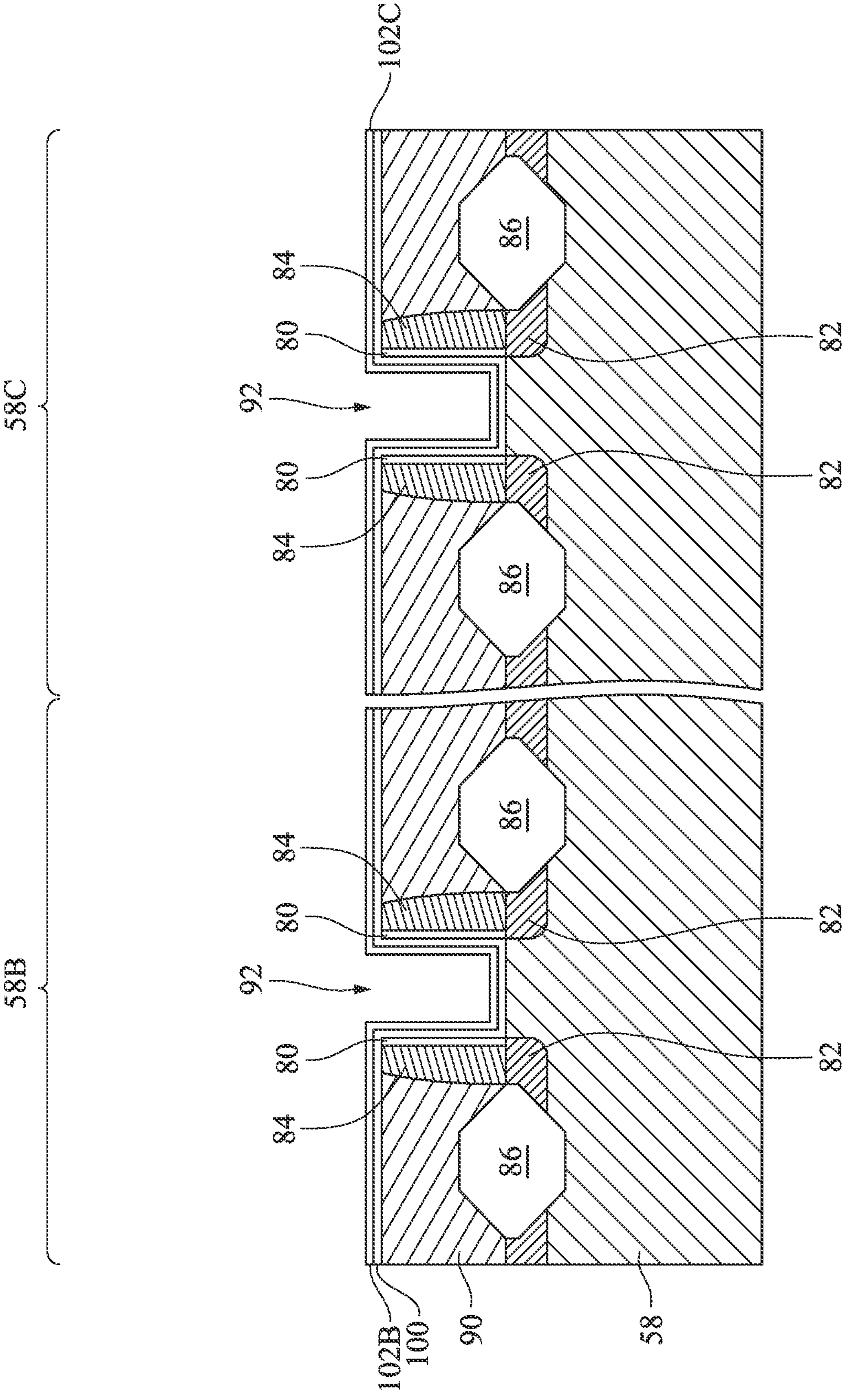

At operation 14 of the process 10 of FIG. 1, an interface layer 100 is formed in the recesses 92, as shown in FIG. 14. The interface layer 100 is conformally formed over the fin 58, and thus the interface layer 100 lines sidewalls and the bottom surface of the recesses 92. The interface layer 100 may also cover the upper surface of the ILD 90. In accordance with some embodiments, the interface layer 100 is an oxide of the material of the fin 58, and may be formed by, e.g., oxidizing the fins 58 in the recesses 92. In certain embodiments, the interfacial layer 100 may include a dielectric material such as a silicon oxide layer ($SiO_2$), a silicon oxynitride (SiON) layer, and the like. In some embodiments, the interfacial layer 100 may include native oxide or chemical oxide. The interface layer 100 may also be formed by a deposition process, such as a chemical vapor deposition (CVD) process, a physical vapor deposition (PVD) process, an atomic layer deposition (ALD) process, or the like. The interfacial layer 100 maybe formed to an initial thickness in a range from about 5 Å to about 10 Å.

At operation 16 of the process 10 of FIG. 1, a first gate dielectric layer 102 is formed over the interface layer 100, as shown in FIG. 14. The first gate dielectric layer 102 may be deposited conformally in the recesses 92, such as on the top surfaces and the sidewalls of the fins 58 and on sidewalls of the interface layer 100 in the recesses 92. The first gate dielectric layer 102 may also be formed along top surfaces of the ILD 90. In accordance with some embodiments, the first gate dielectric layer 102 is a high-k dielectric material having a k value greater than about 7, about 9, about 11, about 13, or about 15, and may include a metal oxide or a silicate of Hf, Al, Pr, Zr, La, Mg, Ba, Ti, Pb, Gd, Ho, Er, Tm, Yb, Lu, Ce, Nd, Pm, Sm, Eu, Tb, Dy and combinations thereof. In some embodiments, the first gate dielectric layer 102 comprises an oxide of a rare earth metal. In some embodiments, the first gate dielectric layer 102 comprises an oxide of an element having a bandgap greater than about 3.5 eV, about 4 eV, about 5 eV, about 5.3 eV, about 5.5 eV, about 5.7 eV, or about 6 eV. In some embodiments, the first gate dielectric layer 102 is thermally stable up to temperature of at least about 850 C, about 900 C, about 900 C, or about 1000 C.

In some embodiments, the first gate dielectric layer 102 may comprise hafnium oxide (HfOx), AlOx, lanthanum oxide (LaOx), LaSixOy, $La_2O_3$, $Gd_2O_3$, $HoO_3$, $Er_2O_3$, $Tm_2O_3$, $Yb_2O_3$, $Lu_2O_3$, HfLaxOy, TiOx, HfZrxOy, HfSixOy, Pr2O3, ZrOx, ZrSixOy, TaOx, YOx, SrTixOy, BaTixOy (BTO), BaZrxOy, HfZrxOy, HfZrxOyNz, HfLaxOy, HfSixOy, HfSixOyNz, LaSixOy, AlSixOy, HfTaxOy, HfTixOy, (Ba,Sr)TixOy (BST), combinations thereof, or other suitable material.

The formation methods of the first gate dielectric layer 102 may include Molecular-Beam Deposition (MBD), ALD, CVD, PECVD, and the like. In other embodiments, the first gate dielectric layer 102 may be directly formed on the fins 58 if the interfacial layer 100 is not present. In some embodiments, the first gate dielectric layers 102 are deposited by ALD and/or other suitable methods. In some embodiments, a thickness of the first gate dielectric layers 244 is about 5 Å to about 50 Å, depending on the number of ALD cycles performed. For example, in some embodiments, one ALD cycle is performed. In some embodiments, 20 cycles are performed. In some embodiments, between 1 and 20 cycles are performed. Any number of ALD cycles may be performed. In some embodiments, the first dielectric layer 102 has a physical thickness of about 1 nm to about 20 nm, and is not limited.

In some embodiments, the first gate dielectric layer 102 has a leakage current density below 10-8 A/cm2 at V=±1V, at EOT=1.4 nm, and at room temperature. In some embodiments, the first gate dielectric layer 102 has a leakage current density below 10-8 A/cm2 at V=about ±0.5 V, about ±0.6 V, about ±0.7 V, about ±0.8 V, about ±0.9 V, or about ±1V, at about EOT=1.0 nm, about EOT=1.1 nm, about EOT=1.2 nm, about EOT=1.3 nm, or about EOT=1.4 nm, and at about 0° C., about 10 C, about 20 C, or about 25 C, after being subject to a temperature of at least about 850 C, about 900 C, about 900 C, or about 1000 C for at least about 10 s, about 11 s, about 12 s, about 13 s, about 14 s, or about 15 s. In some embodiments, the first gate dielectric layer 102 is amorphous and does not crystallize and/or does not experience a phase change in response to being subject to a temperature of at least about 850 C, about 900 C, about 900 C, or about 1000 C for at least about 10 s, about 11 s, about 12 s, about 13 s, about 14 s, or about 15 s.

In some embodiments, the first gate dielectric layer 102 includes praseodymium oxide (Pr2O3). It should be noted that hafnium oxide ($HfO_2$) has a relative high dielectric constant value (about 20 to 25), however, hafnium oxide has a leakage current density higher than that of $Pr_2O_3$. Furthermore, the hafnium oxide dielectric has poor thermal stability and faces recrystallization at temperature above 850 C. In other words, a hafnium oxide dielectric material, when used as the first gate dielectric layer 102, is crystallized during a high thermal process, so that the crystal defects generated in the hafnium oxide dielectric layer cause an increase in leakage current. In some embodiments, the praseodymium oxide layer has a composition of $Pr_xO_y$, where x is between about 0.1 and about 2, and where y is between about 0.1 and about 3, for example, $Pr_2O_3$.

The first gate dielectric layer 102 may be formed by any suitable method such as, for example, CVD, ALD, PVD, HDP-CVD, MO-CVD, RP-CVD, PE-CVD, LP-CVD, AL-CVD, AP-CVD, and/or other suitable methods.

In an embodiment, an ALD process of forming the first gate dielectric layer 102 may include the following steps. First, the semiconductor substrate 50 is loaded into a reaction chamber. Then, a pulse of a metal precursor is injected into the reaction chamber loaded with the semiconductor substrate 50 for a first period of time. The metal precursor of the first ALD process may include a metal-organic compound in an embodiment.

In an embodiment, the first gate dielectric layer 102 can be formed by electron beam evaporation, where an electron beam provided by an electron gun hits a Pr6O11 source, which vaporizes. The vapor is deposited onto the interfacial layer to form, for example, a praseodymium oxide layer. In an embodiment, the praseodymium oxide layer can be formed by atomic layer deposition (ALD) using tris(ethyl cyclopentadienyl)Pr (Pr(EtCp)3) precursor. The thickness of the ($Pr_2O_3$) layer can be controlled by repeating a number of ALD cycles.

In some embodiments, the transistors formed have a voltage threshold (Vt), which is tuned or modified or controlled based on the thickness of the first gate dielectric layer 102. In addition, in some embodiments, a first transistor having a first Vt may be formed in region 58B and a second transistor having a second Vt may be formed in region 58C.

In some embodiments, a manufacturing method resulting in different transistors having different thicknesses of the first gate dielectric layer 102 is used. For example, a hard mask, as understood by those of skill in the art, may be formed over region 58C and may be not formed over region 58B. A first number x of ALD cycles may be performed so as to generate a first gate dielectric layer 102 over the interfacial layer 100 in region 58B and over the interfacial layer 100 and the hard mask in region 58C. The hard mask and the first gate dielectric layer 102 may then be removed from region 58C. A second number y of ALD cycles may be performed so as to generate a first gate dielectric layer 102 over the interfacial layer 100 and the previously formed first gate dielectric layer 102 in region 58B and over the interfacial layer 100 in region 58C. Accordingly, the transistor in region 58B has a first gate dielectric layer 102B on the interfacial layer 100 having been formed with x+y ALD cycles, and the transistor in region 58C has a first gate dielectric layer 102C on the interfacial layer 100 having been formed with y ALD cycles. Accordingly, the transistor in region 58B has a different Vt than that of the transistor in region 58C. Other manufacturing methods may be used to achieve different threshold voltages for different transistors.

In some embodiments, the first gate dielectric layer 102C of the second transistor formed in region 58C has a thickness which is about 0.1, about 0.2, about 0.3, about 0.4, about 0.5, about 0.6, about 0.7, about 0.8, about 0.9, about 1.0, about 1.1, about 1.2, about 1.3, about 1.4, about 1.5, about 1.6, about 1.7, about 1.8, about 1.9, or about 2.0 times the thickness of the first gate dielectric layer 102B of the first transistor formed in region 58B. Other thickness ratios may be used.

Figure 15:
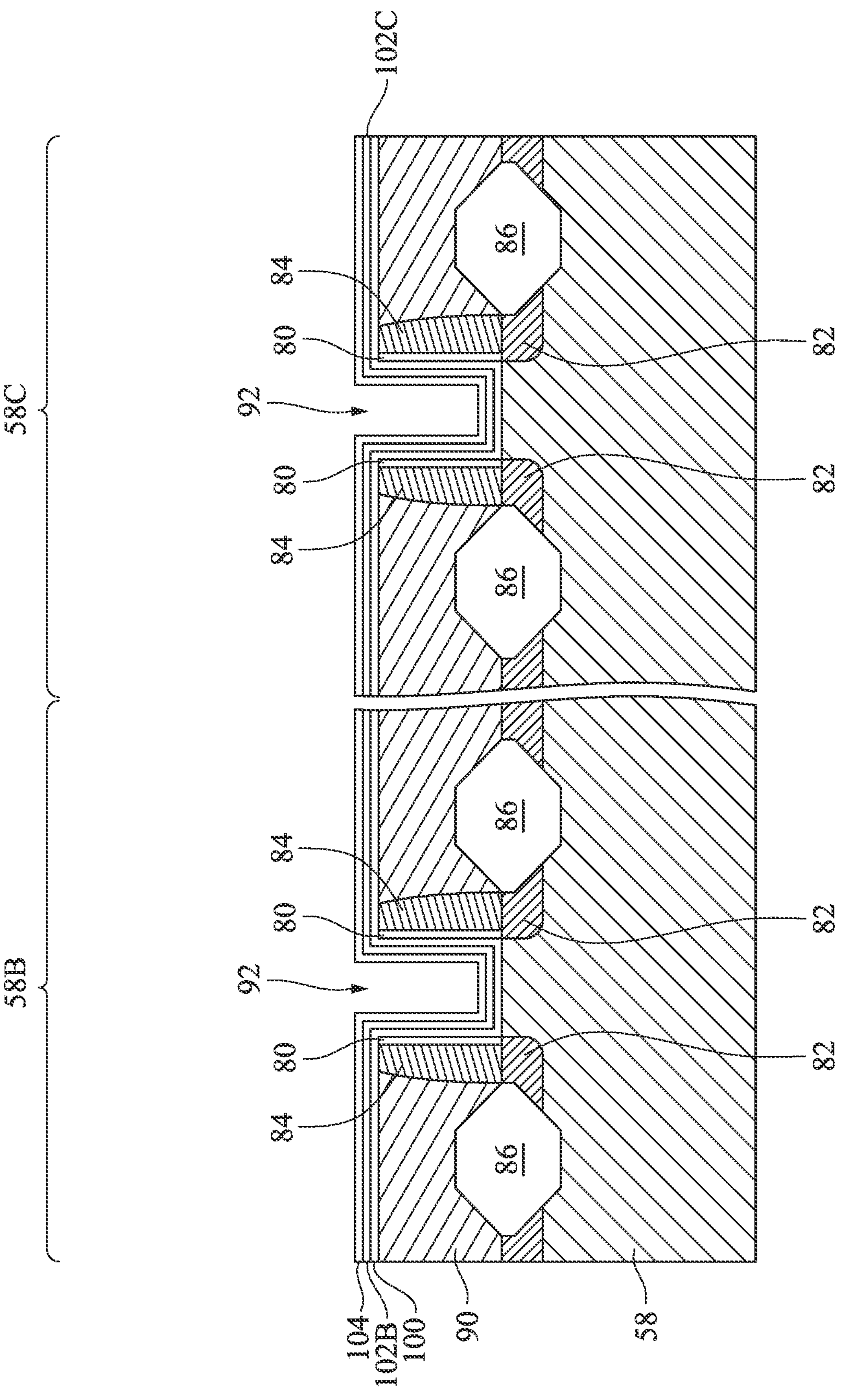

At operation 18 of the process 10 of FIG. 1, a dipole layer 104 is formed on the first gate dielectric layer 102, as shown in FIG. 15. The dipole layer 104 may, for example, include (Al) and oxygen (O) aluminum oxide, and form a P dipole. In some embodiments, selection of the material of the dipole layer 104 depends on the conductivity type of the transistors being formed. For example, a dipole material suitable for n-type devices (also referred to as an n-type dipole material) may include lanthanoid oxide (La2O3), yttrium oxide (Y2O3), titanium oxide (TiO2), other n-type dipole material, or combinations thereof; and a dipole material suitable for p-type devices (also referred to as a p-type dipole material) may include aluminum oxide ($Al_2O_3$), $TiO_2$, other p-type dipole material, or combinations thereof. In the depicted embodiment, dipole layer 104 is formed over the gate dielectric layers 102B and 102C. The dipole layer 104 may, for example, be formed directly on a surface of the first gate dielectric layers 102B and 102C. The dipole layer 104 may be characterized by Al—O bonds. In general, the dipole layer 104 may be an aluminum oxide layer. In some embodiments, the aluminum oxide layer is a conformal $Al_2O_3$ layer formed directly on the first gate dielectric layers 102B and 102C.

In some embodiments, the aluminum layer can be formed by coating techniques including e-beam deposition, ion assisted e-beam deposition (IAD), magnetron sputtering, ion beam deposition (IBD) and electron cyclotron resonance sputtering (ECR). Ion assisted e-beam deposition can produce a dense amorphous aluminum film. In an exemplary embodiment, a conformal aluminum oxide film can be formed by plasma-enhanced atomic layer deposition, which includes adsorbing an aluminum compound containing an Al—C bond and an Al—O—C bond, providing an oxidizing gas and an inert gas, applying radio frequency (RF) power to the oxidizing gas and the inert gas to react the adsorbed aluminum compound to form a conformal film of aluminum oxide on the first high-k dielectric layer. In an embodiment, the dipole layer 104 has a physical thickness of about 0.1 nm to about 1.0 nm, and is not limited.

In some embodiments, an annealing (i.e., a heat treatment) process is performed after the formation of the dipole layer 104 to diffuse one or more constituents of the dipole layer 104, for example, aluminum atoms, into the first gate dielectric layer 102 to form dipole elements. The annealing process may be performed at a temperature of from about 500° C. to about 1200° C. or from about 550° C. to about 1050° C. The annealing process can be performed for a duration in a range of several seconds (e.g., 5 seconds) to several minutes (e.g., 20 minutes). In some embodiments, the annealing temperature is from about 800 C to about 1100 C, and the annealing time duration is about 10 seconds to 10 minutes without having performance degradation of the first gate dielectric layer. In some embodiments, the annealing time may depend on the annealing temperature. It should be appreciated that other annealing processes may be performed at other temperatures and for other time periods.

In some embodiments, during the annealing process, some of the dipole inducing element of the dipole layer 104 is driven through the gate dielectric layers 102B and 102C such that the dipole-inducing element is formed at the interfaces of the gate dielectric layers 102B and 102C and interface layer 100. The dipole inducing element creates dipole interfaces between the interface layer 100 and gate dielectric layer 102, which may modulate the effective work function of subsequently formed metal gates.

After the annealing process, excess portions of the dipole layer 104 may be removed. The removal may be accomplished, for example, by etching the dipole layer 104 with, for example, a hydrogen peroxide mixture. In some embodiments, after the etching, a sacrificial layer is formed on the gate dielectric layers 102B and 102C. The sacrificial layer is a sacrificial layer that will be removed in subsequent processing. Although the etching process is performed to remove the dipole layer 104, some residual portions of the dipole layer 104 may remain even after the removal etching process. In particular, some particles (e.g., residues or atoms) of the dipole-inducing element may remain on top surfaces of the gate dielectric layers 102B and 102C. The material of the sacrificial layer is a material that reacts (e.g., bonds to or interacts) with the dipole-inducing element. The sacrificial layer may, for example, be formed from TiAl, TiN, TiAlN, silicon-doped TiN (TiSiN), TaN, or another material that bonds to or interacts with the dipole-inducing elements, and may be formed by a deposition process such as ALD or CVD. In an embodiment, the sacrificial layer is formed to a thickness of from about 10 Å to about 30 Å.

If used, the sacrificial layer may be removed with an acceptable etching process. In an embodiment, the sacrificial layer is removed with a wet etching process using an Ammonium-Hydroxide Peroxide Mixture (APM). The APM may include $NH_4OH$, $H_2O_2$ and $H_2O$, respectively, at ratios of from about 1:1:3 to about 1:1:100. The amount of $H_2O$ may depend on the temperature of the wet etch. The wet etch may be performed at a temperature of from about 30° C. to about 80° C., and may be performed for a time period of from about 10 seconds to about 500 seconds. It should be appreciated that other etch process parameters (e.g., etchants, ratios, temperatures, and/or time periods) may be used. At least some of the residual particles of the dipole inducing element are removed with the sacrificial layer.

In other embodiments, the heat treatment is performed after the formation of subsequent steps. In some embodiments, the annealing (heat treatment) process can be performed at a temperature ranging from about 500 C to about 1200 C. The annealing process can be performed for a duration in a range of several seconds (e.g., 5 seconds) to several minutes (e.g., 20 minutes). In some embodiments, the annealing temperature is from about 800 C to about 1100 C, and the annealing time duration is about 10 seconds to 10 minutes without having performance degradation of the first gate dielectric layer 102. The annealing process drives some or all aluminum atoms into the first gate dielectric layer 102 which forms dipoles, which can be used to control the threshold voltage of a subsequently formed semiconductor device (e.g., a FinFET, a planar FET, a gate-all-around device, and the like).

In some embodiments, annealing is not performed, and the dipole layer 104 substantially remains on the first gate dielectric layer. In some embodiments, annealing is performed, and the dipole layer 104 substantially remains on the first gate dielectric layer despite the annealing process. For example, the dipole layer 104 may substantially remain on a first gate dielectric layer 102 comprising $Pr_2O_3$. Accordingly, the threshold voltage of the transistor is controlled or dominated or affected by the thickness of the first gate dielectric layer 102.

Figure 16:
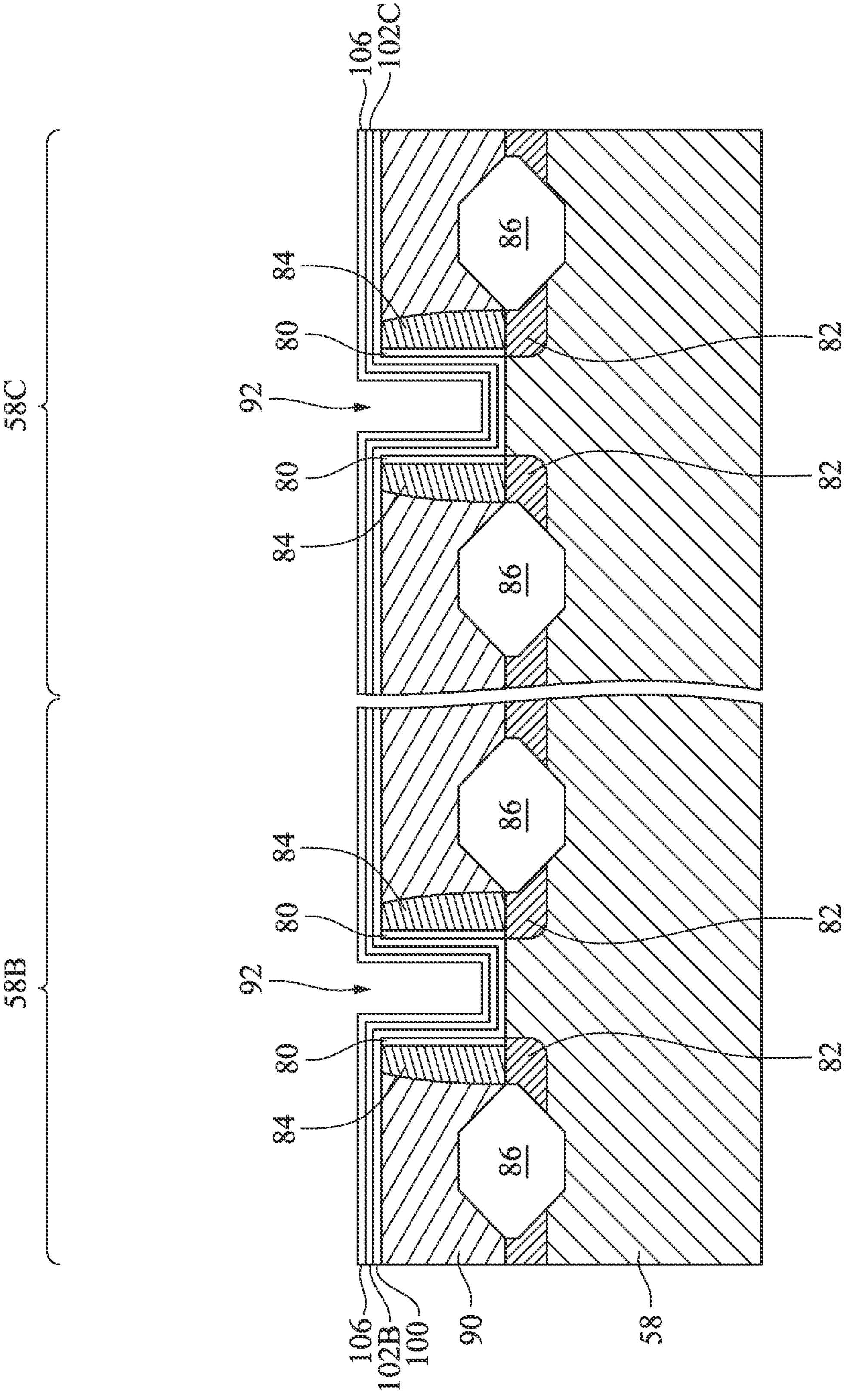

At operation 20 of the process 10 of FIG. 1, a second dielectric layer 106 is formed on the gate dielectric layers 102B and 102C, as shown in FIG. 16. In some embodiments, the second high-k dielectric layer 106 includes one or more oxides of a metal (e.g., hafnium, zirconium, praseodymium) or a metal compound (e.g., praseodymium and hafnium). The second dielectric layer 106 may include any of the materials which may be used for the first dielectric layer 102. For example, in some embodiments, the second dielectric layer 106 includes one or more oxides selected from the group consisting of $HfO_2$, $ZrO_2$, $Pr_2O_3$, $Pr_{2x}Hf_{2(1-x)}O_y$, where $0 \le x \le 1$, and $0 < y \le 3$. In some embodiments, other high-k dielectric materials are used. The second dielectric layer 106 can be formed by deposition over the dipole layer 104. The second dielectric layer 106 can be deposited by chemical vapor deposition (CVD), physical vapor deposition (PVD), molecular beam deposition (MBD), pulsed laser deposition (PLD), atomic layer deposition (ALD), and the like. In an embodiment, the second dielectric layer 106 has a physical thickness of about 1 nm to about 20 nm, and is not limited.

Figure 17:
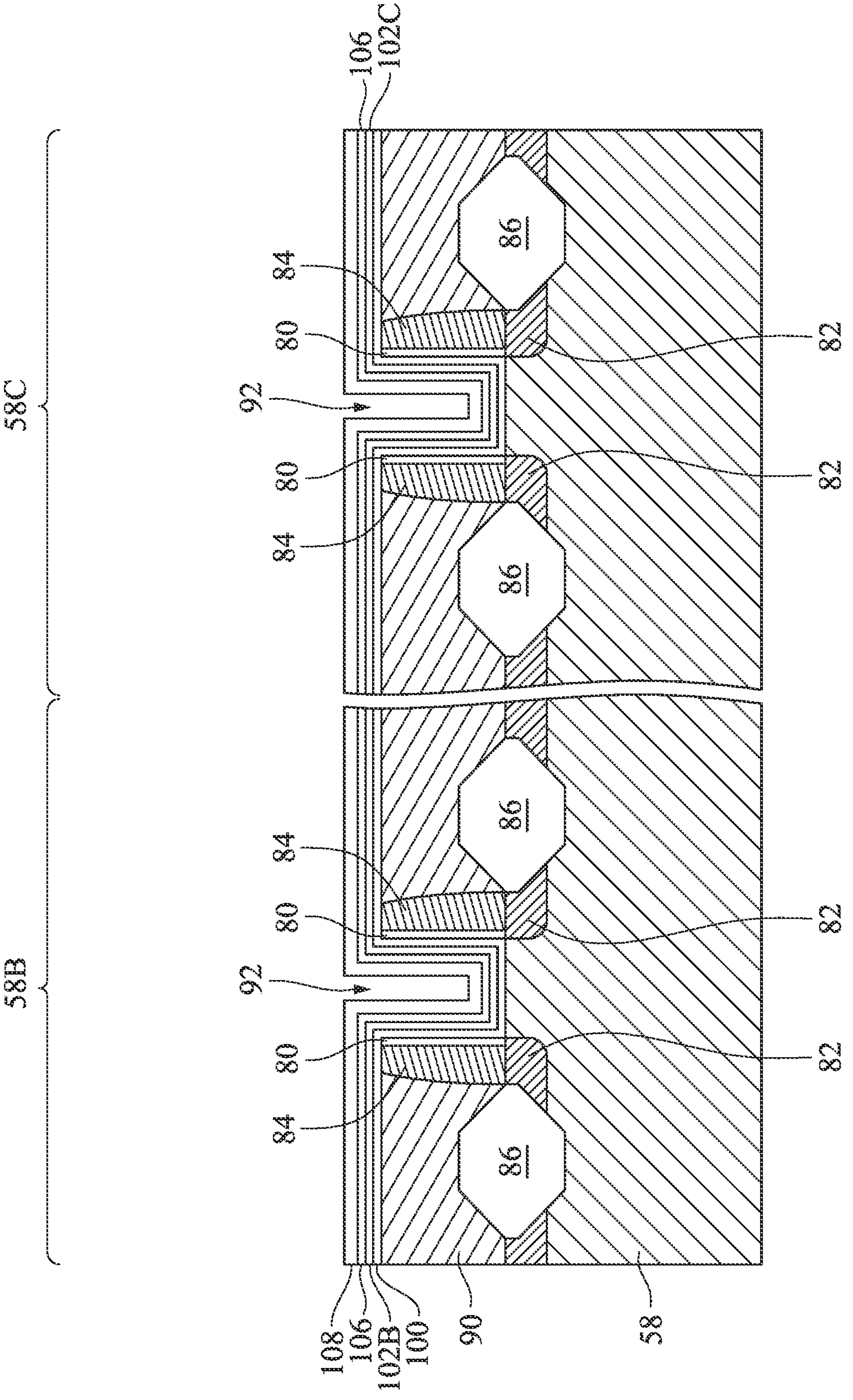

At operation 22 of the process 10 of FIG. 1, a conductive work function layer 108 is deposited over the second dielectric layer 106, as shown in FIG. 17. Conductive work function layer 108 may be chosen to tune or further tune the work function value of the transistor devices so that a desired threshold voltage Vt can be achieved in the transistors that is formed. Examples of materials for the conductive work function layer 108 for a gate structure for n-type transistor devices include Ti, Ag, TaAl, TaAlC, TiAlN, TaC, TaCN, TaSiN, Mn, Zr, other suitable work function materials, or combinations thereof. Examples of materials for the conductive work function layer 108 for p-type transistor devices include TiN, TaN, Ru, Mo, Al, WN, ZrSi2, MoSi2, TaSi2, NiSi2, WN, other suitable work function materials, or combinations thereof.

Each of the conductive work function layers 108 may have a thickness selected so that a desired threshold voltage Vt can be achieved in the transistors that are formed. For example, the thickness of each of the conductive work function layer 108 may have a thickness in a range from about 2.5 angstroms to about 30 angstroms. For example, the conductive work function layer 108 may have a combined thickness of less than about 2.5 A. In some embodiments, the conductive work function layer 108 have a combined thickness of about 2.5 A, about 5 A, about 7.5 A, about 10 A, about 12.5 A, about 15 A, about 17.5 A, about 20 A, about 22.5 A, about 25 A, about 27.5 A, or about 30 A. In some embodiments, the conductive work function layer 108 may have a combined thickness of greater than about 30 A.

Figure 18:
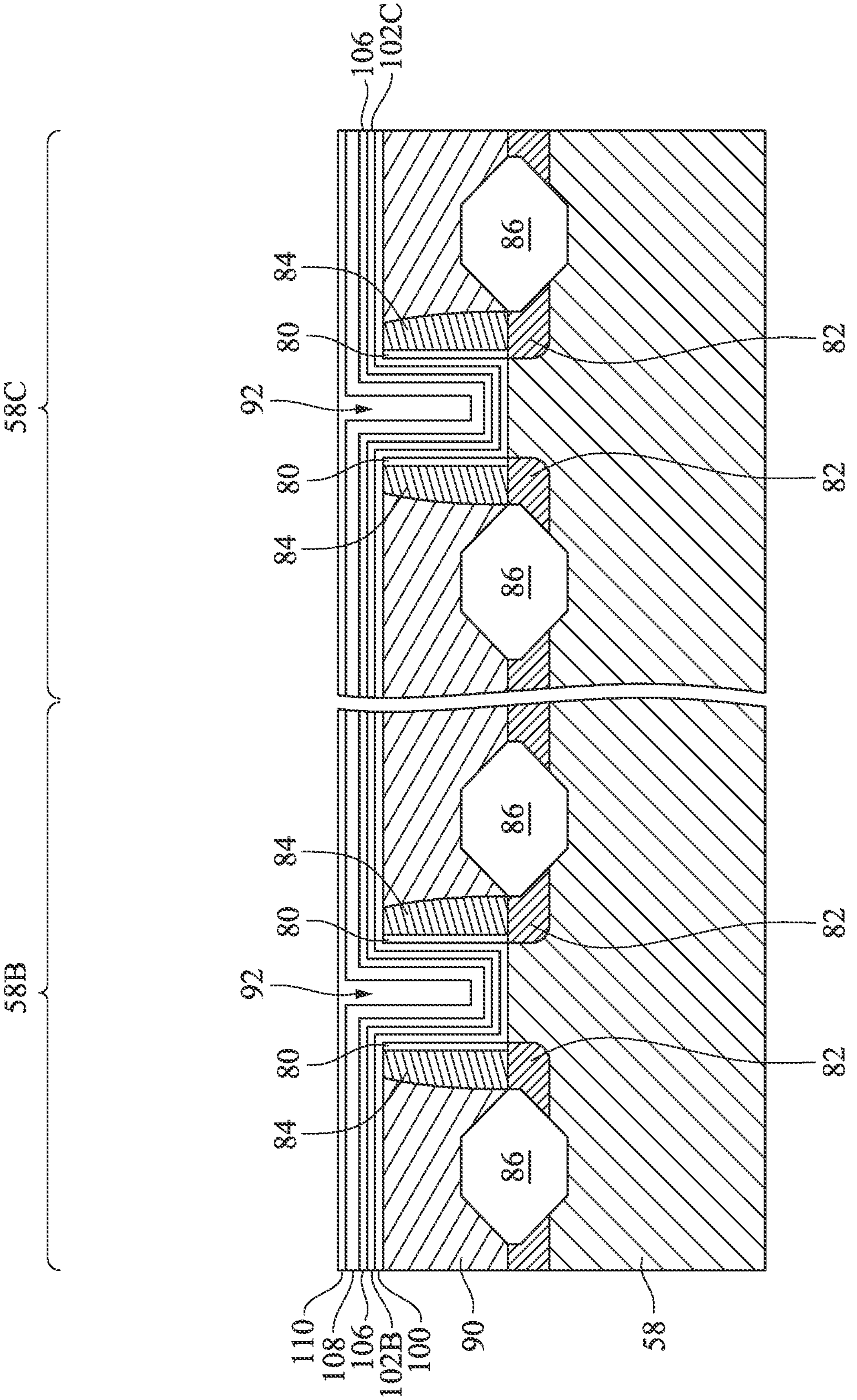

At operation 24 of the process 10 of FIG. 1, a fill metal layer 110 is deposited over the conductive work function layer 108, as shown in FIG. 18. In certain embodiments, the fill metal layer 110 may comprise Titanium, TiN, Tantalum, TaN, TaC, tungsten, cobalt, aluminum, ruthenium, copper, other suitable metals, multi-layers thereof, a combination thereof, multiple layers thereof, or the like. The fill metal layer 110 may be deposited by a suitable process, such as CVD, physical vapor deposition (PVD), sputtering, ALD, PECVD, plating, or other deposition processes.

In some embodiments, a glue metal layer (not shown) may be deposited, for example, by ALD, CVD, PVD, and/or other suitable process, on the conductive work function layer 108, and the fill metal layer 110 is deposited on the glue layer. The glue layer may use materials that promote or enhance adhesion to the fill metal layer 110, which is to be formed on the glue layer. In some embodiments, the glue layer may also provide a desired work function and adjust Vt of the transistor.

In some embodiments, a first glue layer for p-type FinFETs comprises a p-type work function metal layer, and a second glue layer for n-type FinFETs comprises an n-type work function metal layer. In some embodiments, a same glue layer is used for both p-type and n-type FinFETs. In some embodiments, only one of p-type and n-type FinFETs use a glue layer.

In an embodiment, the glue layer has a relatively small thickness (e.g., less than 3 nm, or about 2 nm to about 3 nm) over the fins in order to achieve a designed work function for the FinFET. In some embodiments, the glue layer may be thicker on one of p-type and n-type FinFETs, and thinner on the other of p-type and n-type FinFETs.

The choice of metal and thickness to be used in the glue layer may be determined or influenced by an overall threshold voltage desired for the FinFET device being formed.

Exemplary p-type work function metals include Ti, TiN, TaN, Ru, Mo, Al, WN, ZrSi2, M0Si2, TaSi2, NiSi2, WN, and/or combinations thereof, and exemplary n-type work function metals include Ti, Ag, TaAl, TaAlC, TiAlN, TaC, TaCN, TaSiN, Mn, Zr, and/or combinations thereof. In some embodiments, the glue layer does not significantly impact the work function (e.g., by keeping the glue metal layer relatively thin), because the work function are substantially determined by the conductive work function layers 108.

Figure 19:
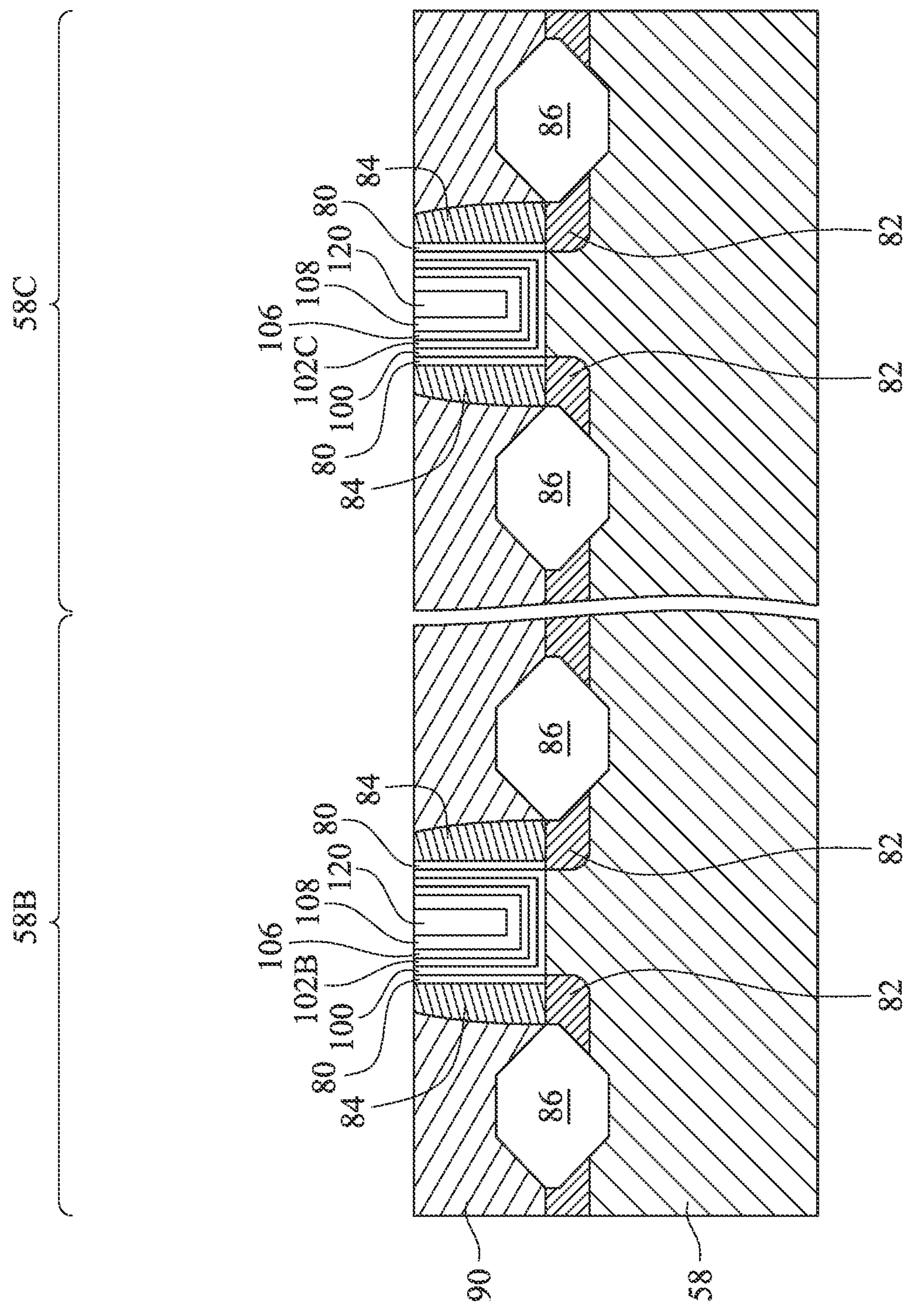

Also at operation 24 of the process 10 of FIG. 1, a planarization process, such as a CMP, is performed to remove the excess portions of the interface layer 100, first gate dielectric layers 102B and 102C, the dipole layer 104, the second gate dielectric layer 106, conductive work function layer 108, and fill metal layer 110, which removed excess portions are removed from the top surface of the ILD 90, as shown in FIG. 19. The remaining portions of the fill metal layer 110 form gate electrodes 120, which in combination with the other layers, form replacement gates of the resulting FinFETs. The interface layer 100, first gate dielectric layers 102B and 102C, the dipole layer 104, the second gate dielectric layer 106, conductive work function layer 108, and gate electrodes 120 may be collectively referred to as the "gates" or "gate stacks" of the resulting FinFETs. The gate stacks may extend along sidewalls of the channel region of the fins 58.

Figure 20:
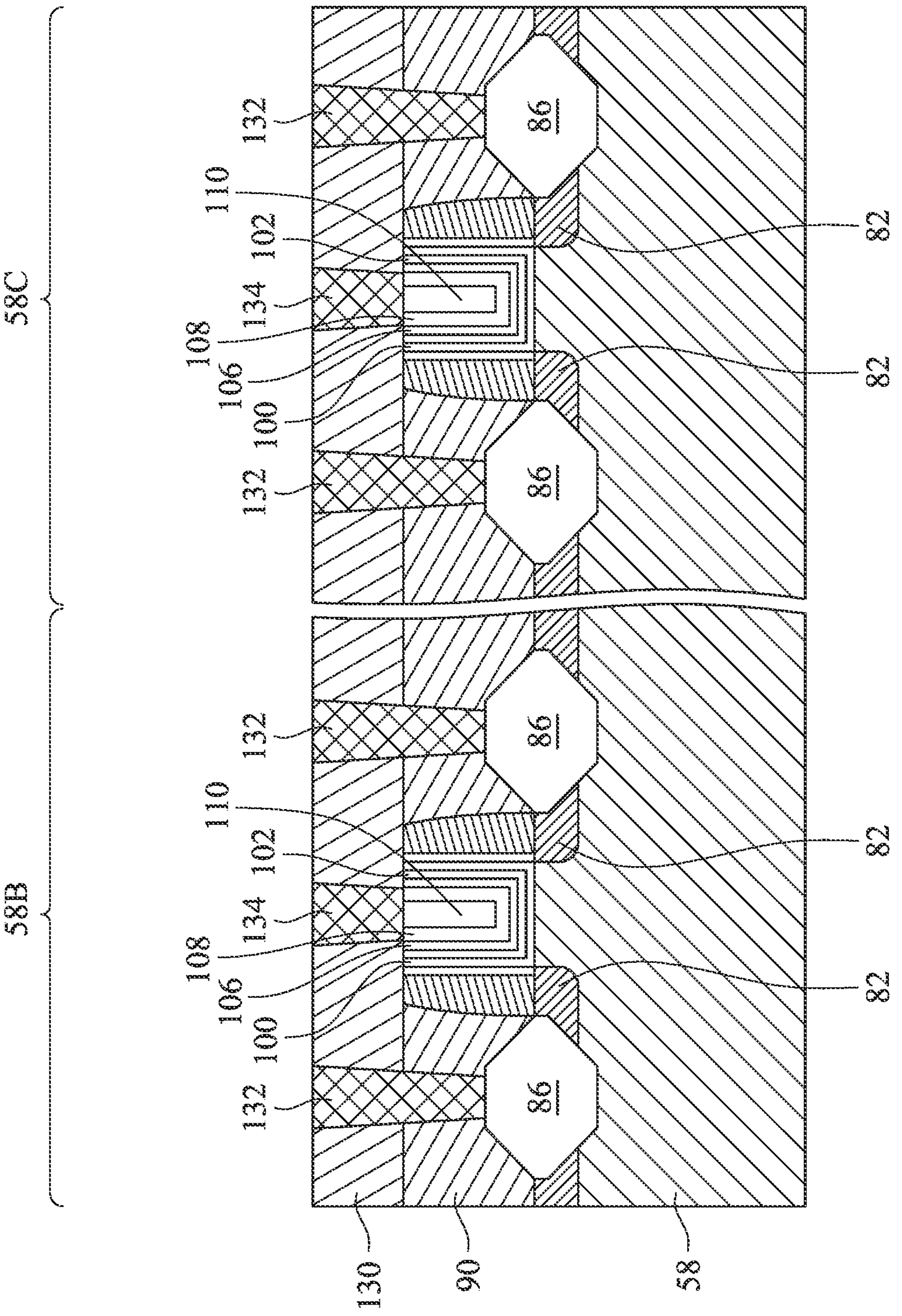

At operation 26 of the process 100 of FIG. 1, the structure may be further processed as shown in FIG. 20. An ILD 130 is formed over the gate stacks and ILD 90. In an embodiment, the ILD 130 is a flowable film formed by a flowable CVD method. In some embodiments, the ILD 130 is formed of a dielectric material such as PSG, BSG, BPSG, USG, or the like, and may be deposited by any suitable method, such as CVD and PECVD.

Source/drain contacts 132 and gate contacts 134 are formed through the ILDs 90 and 130. Openings for the source/drain contacts 132 are formed through the ILDs 90 and 130, and openings for the gate contacts 134 are formed through the ILD 130. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 130. The remaining liner and conductive material form the source/drain contacts 132 and gate contacts 134 in the openings. An anneal process may be performed to form a silicide at the interface between the epitaxial source/drain regions 86 and the source/drain contacts 132. The source/drain contacts 132 are physically and electrically coupled to the epitaxial source/drain regions 86, and the gate contacts 134 are physically and electrically coupled to the gate electrodes 120. The source/drain contacts 132 and gate contacts 134 may be formed in different processes, or may be formed in the same process. Although shown as being formed in the same cross-sections, it should be appreciated that each of the source/drain contacts 132 and gate contacts 134 may be formed in different cross-sections, which may avoid shorting of the contacts.

According to some embodiments, a method of forming a semiconductor device comprises forming a first transistor in a first region and forming a second transistor in a second region of a semiconductor substrate. For example, FIG. 20 shows a first FinFET transistor in a first region 58B and a second FinFET transistor in a second region 58C of a semiconductor substrate. As another example, FIG. 29 described below shows a first GAA transistor 201B in a first region and a second GAA transistor 201C in a second region of a semiconductor substrate. The processes described below refer to processes described above in connection to transistors formed in FIG. 20 and FIG. 29.

In the method, forming the first transistor having a first gate stack in a first region of a semiconductor substrate includes at least, forming an interfacial layer on the semiconductor substrate, forming a first dielectric layer on the interfacial layer, with the first dielectric layer having a first thickness. The method also includes forming a first dipole layer on the first dielectric layer, forming a second dielectric layer on the first dipole layer, and forming a first conductive work function layer on the second dielectric layer.

The method also includes forming a second transistor comprising a second gate stack in a second region of a semiconductor substrate by at least, forming a third dielectric layer on the interfacial layer, with the third dielectric layer having a second thickness. The method also includes forming a second dipole layer on the third dielectric layer, annealing to drive dipole inducing elements from the second dipole layer into the third dielectric layer to the interfacial layer, removing residual second dipole layer, forming a fourth dielectric layer on the third dielectric layer, and forming a second conductive work function layer on the fourth dielectric layer.

The method further includes forming a gate electrode layer over the first conductive work function layer and second conductive work function layer. In the formed semiconductor, the thickness of the first dielectric layer is less than the thickness of the third dielectric layer. Moreover, the first transistor is characterized by a first threshold voltage determined by dipole inducing elements in the first dipole layer on the first dielectric layer, and the second transistor is characterized by a second threshold voltage determined by dipole inducing elements on the interfacial layer.

In an embodiment of the above method, the first transistor is characterized by a first equivalent oxide thickness (EOT) and the second transistor is characterized by a second EOT, and the first EOT is less than or equal to the second EOT. In an example, the first dielectric layer is praseodymium oxide, and third dielectric layer is hafnium oxide. As described above, the praseodymium oxide can be thinner than hafnium oxide because of its lower leakage current. Therefore, even with the dipole layer remaining in the first transistor, the EOT of the first transistor can be thinner than the EOT of the second transistor.

In some embodiments, the first dielectric layer includes a rare earth metal. In some embodiments, forming the first dielectric layer comprises performing a first number of atomic layer deposition (ALD) cycles, and wherein forming the third dielectric layer comprises performing a second number atomic layer deposition (ALD) cycle, wherein the first and second numbers are different. In some embodiments, the first dielectric layer comprises a material which, in response to a 1 V potential, experiences a leakage current density less than 10-8 A/cm2, when having an EOT=1.4 nm after being exposed to a temperature of about 1000 C for about 15 s. As explained above, the first dielectric layer can be praseodymium oxide. The first dielectric layer can be an oxide or nitride of a rare earth metal.

According to some embodiments, a method of forming a semiconductor device includes forming a transistor comprising a gate stack on a semiconductor substrate by at least forming a first dielectric layer on the semiconductor substrate, forming a dipole layer on the dielectric layer, forming a second dielectric layer on the dipole layer, forming a conductive work function layer on the second dielectric layer, and forming a gate electrode layer on the conductive work function layer. The method also includes varying a distance between dipole inducing elements in the dipole layer and a surface of the semiconductor substrate by tuning a thickness of the first dielectric layer to adjust a threshold voltage of the transistor.

In some embodiments of the above method, the first dielectric layer comprises praseodymium oxide. In some embodiments the first dielectric layer comprises a rare earth metal. In some embodiments, the first dielectric layer comprises an oxide or nitride of a rare earth metal having a bandgap energy of greater than 5.3 eV. In some embodiments, the first dipole layer comprises aluminum oxide. In some embodiments, the first dielectric layer comprises a material which, in response to a 1 V potential, experiences a leakage current density less than 10-8 A/cm2, when having an EOT=1.4 nm after being exposed to a temperature of about 1000 C for about 15 s. In some embodiments, the transistor is characterized by a threshold voltage determined at least partly by a distance between dipole inducing elements in the first dipole layer on the first dielectric layer and a surface of the semiconductor substrate.

According to some embodiments, a semiconductor device includes a first transistor comprising a first gate stack in a first region of a semiconductor substrate. The first transistor includes a first dielectric layer on the semiconductor substrate, a first dipole layer on the first dielectric layer, a second dielectric layer on the first dipole layer, a conductive work function layer on the second dielectric layer, and a gate electrode layer over the conductive work function layer. The first transistor is characterized by a first threshold voltage determined by a distance between dipole inducing elements in the first dipole layer on the first dielectric layer and a surface of the semiconductor substrate.

In some embodiments of the above device, the first dielectric layer comprises praseodymium oxide. In some embodiments, the first dielectric layer comprises a material which, in response to a 1 V potential, experiences a leakage current density less than 10-8 A/cm2, when having an EOT=1.4 nm. In some embodiments, the first dielectric layer comprises a rare earth metal.

In some embodiments, the above device also includes a second transistor comprising a second gate stack in a second region of a semiconductor substrate. The second transistor includes a third dielectric layer on the semiconductor substrate, the third dielectric layer including dipole inducing elements. The second transistor also includes a fourth dielectric layer on the third dielectric layer, the conductive work function layer on the fourth dielectric layer, and gate electrode layer over the conductive work function layer. The thickness of the first dielectric layer is less than a thickness of the third dielectric layer. The second transistor is characterized by a second threshold voltage determined by dipole inducing elements in the third dielectric layer.

In some embodiments, the first transistor is characterized by a first equivalent oxide thickness (EOT) and the second transistor is characterized by a second EOT, and the first EOT is less than or equal to the second EOT. In some embodiments, the dipole inducing elements in the third dielectric layer are derived from a second dipole layer, which is deposited on the third dielectric layer and subsequently removed following an annealing process to drive the dipole inducing elements into the third dielectric layer.

Figure 21:
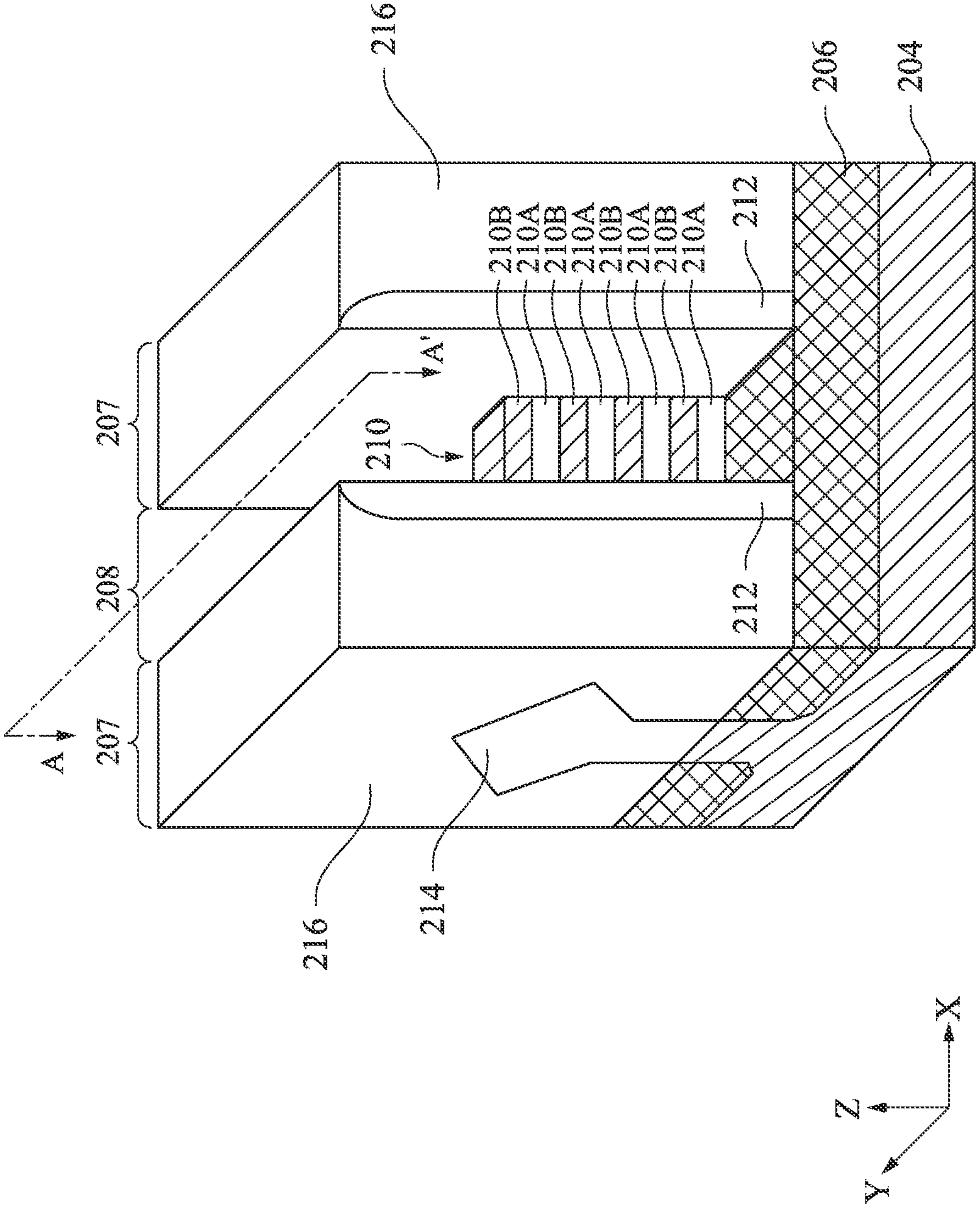
FIG. 21 is a schematic perspective view of a semiconductor substrate at one stage of manufacturing a semiconductor device in accordance with some embodiments.
Figure 22:
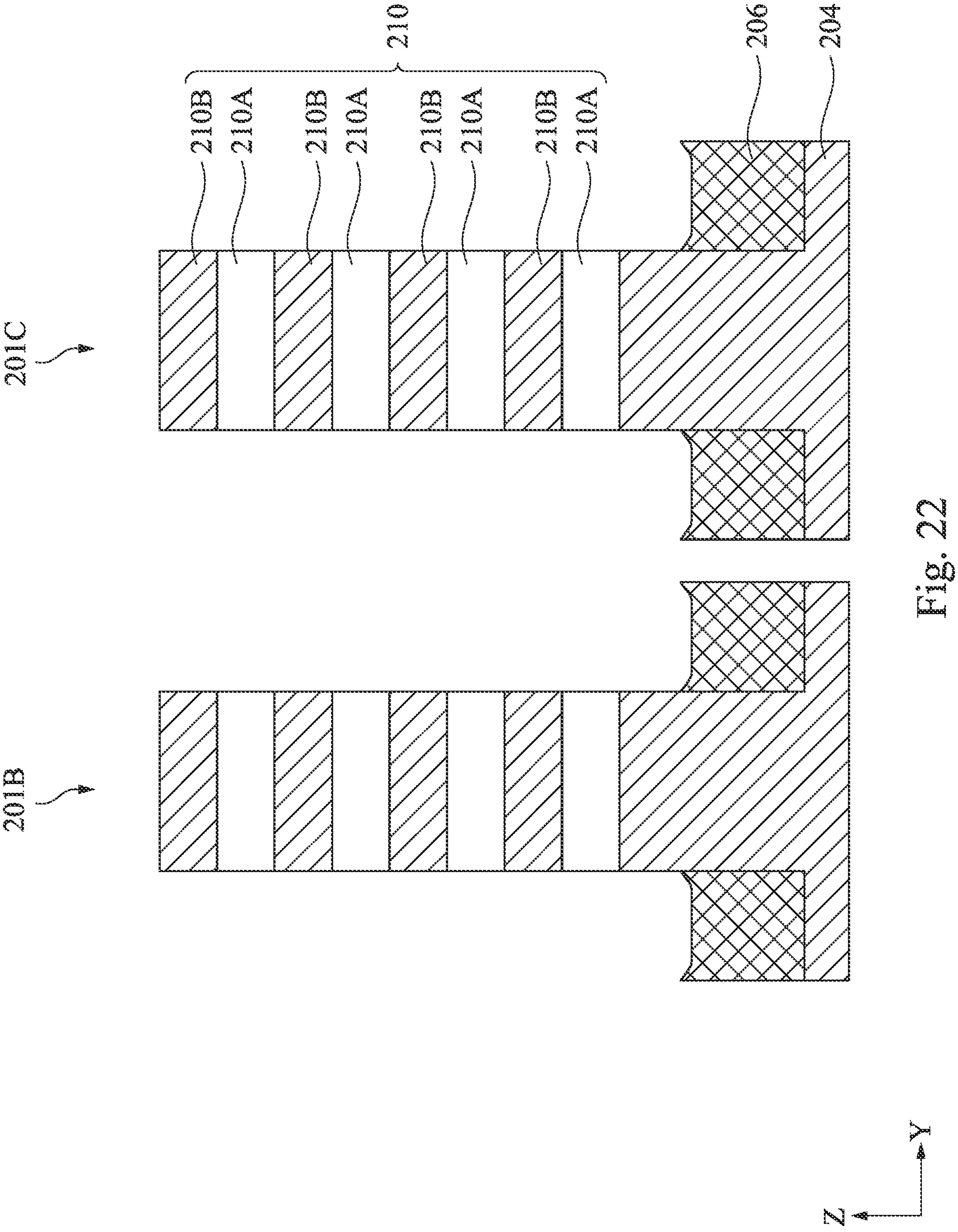
FIGS. 22-29 are schematic cross-section views of a semiconductor substrate at various stages of manufacturing a high-k metal gate structure in accordance with some embodiments.

FIG. 21 is a three-dimensional view of an initial semiconductor structure for a gate all around (GAA) semiconductor device (for example, device 201B in a first region or 201C in second region, discussed below) formed at operation 12 of method 10. FIG. 22 is a cross-section view along plane A-A' in FIG. 21 for the semiconductor devices 201B and 201C. In the illustrated example, device 201B is for a first transistor having a first threshold voltage, and device 201C is for a second transistor having a second threshold voltage.

Referring to FIGS. 21 and 22, the initial semiconductor structure is formed on a substrate 204. The substrate 204 is a bulk substrate that includes silicon. Alternatively or additionally, the bulk substrate includes another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as SiGe, SiPC, GaAsP, AlInAs, AlGaAs, GaInAs, GaInP, and/or GaInAsP; other group III-V materials; other group II-IV materials; or combinations thereof. In some embodiments, the substrate 204 may include indium tin oxide (ITO) glass, include silicon on insulator (SOI) substrate, be strained and/or stressed for performance enhancement.

The substrate 204 may include various doped regions. In some embodiments, the substrate 204 includes n-type doped regions (for example, n-type wells) doped with n-type dopants, such as phosphorus (for example, 31P), arsenic, other n-type dopant, or combinations thereof. In some embodiments, the substrate 204 includes p-type doped region (for example, p-type wells) doped with p-type dopants, such as boron (for example, 11B, BF2), indium, other p-type dopant, or combinations thereof. In some embodiments, the substrate 204 includes doped regions formed with a combination of p-type dopants and n-type dopants. The various doped regions can be formed directly on and/or in the substrate 204, for example, providing a p-well structure, an n-well structure, a dual-well structure, a raised structure, or combinations thereof. An ion implantation process, a diffusion process, and/or other suitable doping process can be performed to form the various doped regions.

The semiconductor structure may also comprise a semiconductor layer stack 210 (hereinafter, stack 210) formed over the substrate 204. In the depicted embodiment, the stack 210 includes alternating semiconductor layers, such as first semiconductor layers 210A including a first semiconductor material and second semiconductor layers 210B including a second semiconductor material that is different from the first semiconductor material. The different semiconductor materials in the semiconductor layers 210A and 210B have different oxidation rates and/or different etch selectivity. In some embodiments, the second semiconductor material of the second semiconductor layers 210B is the same as the substrate 204. For example, the first semiconductor layers 210A comprise silicon germanium (SiGe), and the second semiconductor layers 210B comprise Si (like the substrate 204). Thus, the stack 210 is arranged with alternating SiGe/Si/SiGe/Si/ . . . layers from bottom to top. In some embodiments, the material of the top semiconductor layer may or may not be the same as the bottom semiconductor layer in the stack. For example, for a stack that includes alternating SiGe and Si layers, the bottom semiconductor layer comprises SiGe, and the top semiconductor layer may comprise Si or SiGe. In the depicted embodiment, the bottom semiconductor layer 210A comprises SiGe, while the top semiconductor layer 210B comprises Si. In some embodiments, the second semiconductor layers 210B may be undoped or substantially dopant-free. In other words, no intentional doping is performed when forming the second semiconductor layers 210B. In some other embodiments, the semiconductor layers 210B may be doped with a p-type dopant, such as boron (B, 11B or BF2), gallium (Ga), or combinations thereof, or an n-type dopant, such as phosphorus (P, 31P), arsenic (As), or combinations thereof. The number of the semiconductor layers 210A and 210B in the stack 210 is not limited. For example, the stack 210 may comprise one to ten layers of semiconductor layers 210A or 210B each. In some embodiments, different semiconductor layers 210A and 210B in the stack 210 have the same thickness in the Z-direction. In some other embodiments, different semiconductor layers 210A and 210B in the stack 210 have different thicknesses.

The stack 210 is formed over the substrate 204 using any suitable process. In some embodiments, the semiconductor layers 210A and/or 210B are formed by suitable epitaxy process. For example, semiconductor layers comprising SiGe and Si are formed alternately over the substrate 204 by a molecular beam epitaxy (MBE) process, a chemical vapor deposition (CVD) process, such as a metal organic CVD (MOCVD) process, and/or other suitable epitaxial growth processes. Thereafter, a photoresist and an etching process may be performed to the semiconductor layers to form the stack 210 (comprising semiconductor layers 210A and 210B) in a fin-shape as illustrated in FIG. 22. The fin-shape stack 210 extends along the X-direction and comprises a channel region 208, a source region, and a drain region (hereinafter both referred to as S/D regions 207) (FIG. 21). The S/D regions 207 are interposed by the channel region 208. As illustrated in FIG. 21, the plane A-A' is taken in the channel region 208 of the stack 210.

The semiconductor structures also include an isolation feature 206 formed over the substrate 204 to separate and isolate the active regions. In some embodiments, one or more dielectric materials, such as silicon dioxide (SiO2) and/or silicon nitride (Si3N4), is deposited over the substrate 204 along sidewalls of the stack 210. The dielectric material may be deposited by CVD, plasma enhanced CVD (PECVD), physical vapor deposition (PVD), thermal oxidation, or other techniques. Subsequently, the dielectric material is recessed (for example, by etching) to form the isolation feature 206. In some embodiments, a top surface of the isolation feature 206 is substantially coplanar with or lower than a bottom surface of the lowermost first semiconductor layer 210A, as depicted in FIGS. 21 and 22.

The semiconductor structure also includes gate spacers 212 formed over the stack 210. In some embodiments, the gate spacers 212 comprise a dielectric material, such as silicon dioxide (SiO2), silicon nitride (Si3N4), silicon oxynitride (SiON), or silicon carbide (SiC). The gate spacers 212 are formed by any suitable process. For example, first, a dummy gate stack (comprising polysilicon, not shown) is formed over the channel region 208 of the stack 210. A spacer layer comprising the dielectric material is then deposited (for example, by atomic layer deposition (ALD), CVD, PVD, or other proper process) over the substrate 204 and the dummy gate stack. Subsequently, the spacer layer is anisotropically etched to remove the portions in the X-Y plane (the plane in which the top surface of the substrate 204 is). The remaining portions of the spacer layer become the gate spacers 212.

Thereafter, S/D regions 207 of the stack 210 may be recessed along sidewalls of the gate spacers 212, and inner spacers (not shown) are formed between edges of the semiconductor layers 210B. In some embodiments, S/D regions 207 of the stack 210 are recessed by a S/D etching process performed along the gate spacers 212 to form S/D trenches. The S/D etching process may be a dry etch, a wet etch, or combinations thereof. A time control is performed to the S/D etching process, such that the sidewalls of each semiconductor layers 210A and 210B are exposed in the S/D trenches. Thereafter, portions (edges) of the semiconductor layers 210A exposed in the S/D trenches are selectively removed by a suitable etching process to form gaps between adjacent semiconductor layers 210B. In other words, edges of the semiconductor layers 210B are suspended in the S/D regions 207. Subsequently, inner spacers (not shown) are formed to fill in the gaps between the adjacent semiconductor layers 210B. The inner spacers comprise a dielectric material that is similar to the material of the gate spacers, such as SiO2, Si3N4, SiON, SiC, or combinations thereof. The dielectric material of the inner spacers may be deposited in the S/D trenches and in the gaps between the semiconductor layers 210B by CVD, PVD, ALD, or combinations thereof. Extra dielectric material is removed along sidewalls of the gate spacers 212 until the sidewalls of the semiconductor layers 210B are exposed in the S/D trenches.

Thereafter, epitaxial S/D features 214 are formed in the S/D regions 207 of the stack 210. In some embodiments, the epitaxial S/D features 214 may include a semiconductor material such as silicon (Si) or germanium (Ge); a compound semiconductor such as silicon germanium (SiGe), silicon carbide (SiC), gallium arsenide (GaAs), etc.; an alloy semiconductor; or combinations thereof. An epitaxy process may be implemented to epitaxially grow S/D features 214. The epitaxy process may include CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. Epitaxial S/D features 214 may be doped with n-type dopants and/or p-type dopants. In some embodiments, epitaxial S/D features 214 may include multiple epitaxial semiconductor layers, and different epitaxial semiconductor layers are different in amount of dopant included therein.

The semiconductor structure also includes an interlayer dielectric (ILD) layer 216 formed over the substrate 204. As illustrated in FIG. 21, the ILD 216 is disposed along the gate spacers 212 and covers the isolation feature 206 and the epitaxial S/D features 214. In some embodiments, the ILD layer 216 includes a low-k dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 216 may include a multi-layer structure having multiple dielectric materials and may be formed by a deposition process such as CVD, flowable CVD (FCVD), spin-on-glass (SOG), other suitable methods, or combinations thereof. In some embodiments, an etch stop layer (ESL, not shown) including dielectric material(s) (such as SiO2, SiON, Si3N4, SiCN, SiOC, SiOCN) may be deposited between the ILD layer 216 and the isolation feature 206 and between the ILD layer 216 and the epitaxial S/D features 214.

After the formation of the ILD layer 216, the dummy gate stack may be removed to form a gate trench that exposes the channel region 208 of the stack 210. In some embodiments, removing the dummy gate stack includes one or more etching processes, such as wet etching, dry etching, reactive-ion etching (RIE), or other etching techniques.

Figure 23:
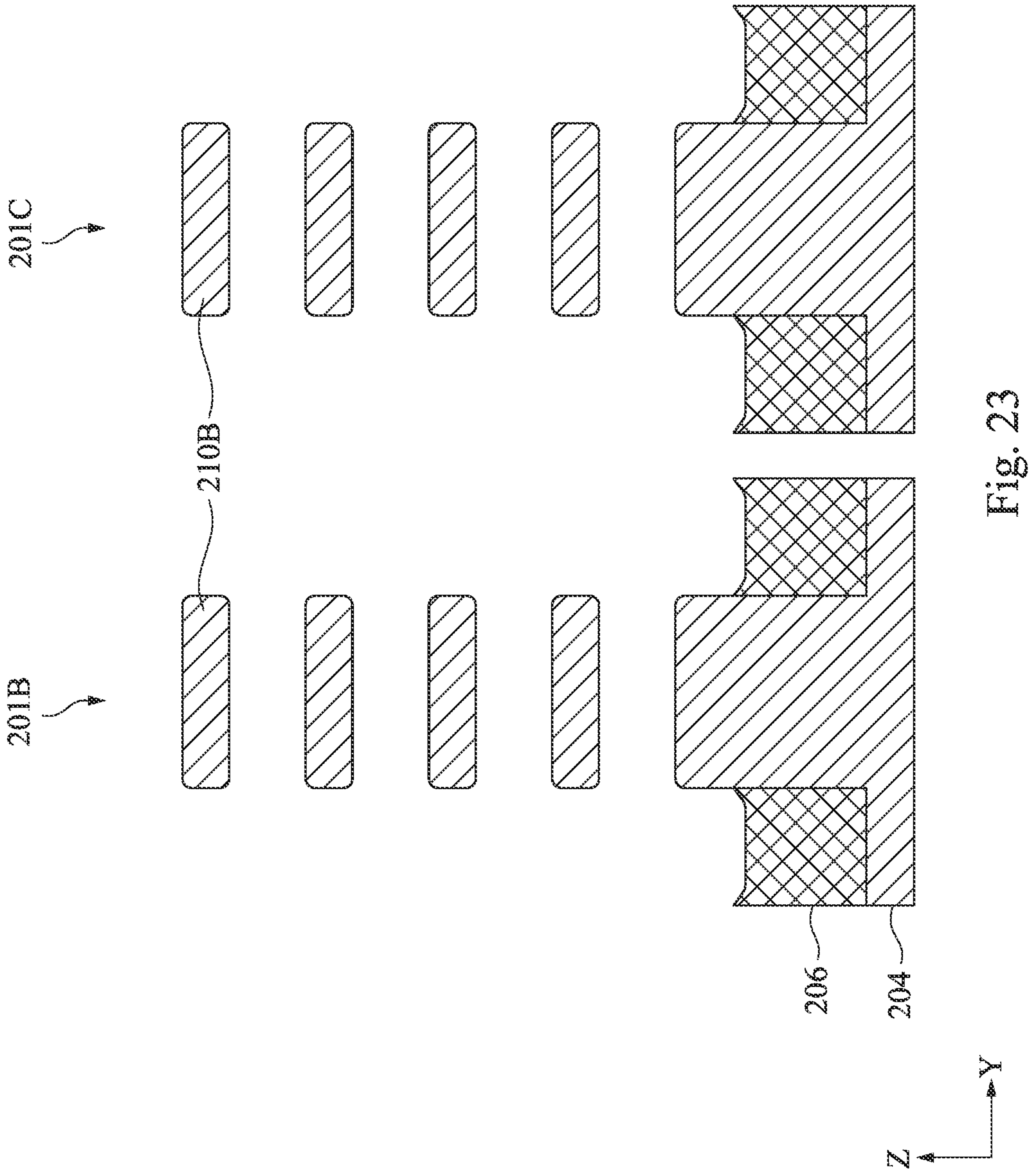

Now referring to FIGS. 1 and 23, also at operation 12, a channel release process is performed, such that the semiconductor layers 210A are removed from the gate trench. As a result, the semiconductor layers 210B are suspended in the channel region. The suspended semiconductor layers 210B (also referred to as channel semiconductor layers) are collectively referred to as a stack structure. The semiconductor layers 210A are removed by a selective etching process that is tuned to remove only the semiconductor layers 210A while the semiconductor layers 210B remain substantially unchanged. The selective etching may be a selective wet etching, a selective dry etching, or a combination thereof. In some embodiments, the selective wet etching process may include a hydro fluoride (HF) or NH4OH etchant. In some embodiments, the selective removal of semiconductor layers 210A may include an oxidation process followed by oxidation removal. For example, the SiGe oxidation process may include forming and patterning various masking layers such that the oxidation is controlled to the SiGe layers 210A. In other embodiments, the SiGe oxidation process is a selective oxidation due to the different compositions of the semiconductor layers 210A and 210B. In some examples, the SiGe oxidation process may be performed by exposing the structure to a wet oxidation process, a dry oxidation process, or a combination thereof. Thereafter, the oxidized semiconductor layers 210A, which include SiGeOx, are removed by an etchant such as NH4OH or diluted HF.

As depicted in FIG. 23, each of the stack structures includes the channel semiconductor layers 210B separated from each other and stacked up along a direction (Z-direction) generally perpendicular to a top surface of the substrate 204 (X-Y plane). In some embodiments, the semiconductor layers 210B are slightly etched or not etched during the operation 12. Further, semiconductor layers 210B may be of any suitable shapes, such as a wire-like shape, a sheet-like shape, or other geometrical shape (for other stack structure GAA transistors). Each of the semiconductor layers 210B has a thickness T1 in the Z-direction, and the adjacent suspended semiconductor layers 210B are separated with a space S1 in the Z-direction. In some embodiments, the thickness T1 is about 3 nm to about 20 nm. In some embodiments, the space S1 is about 5 nm to about 15 nm.

Figure 24:
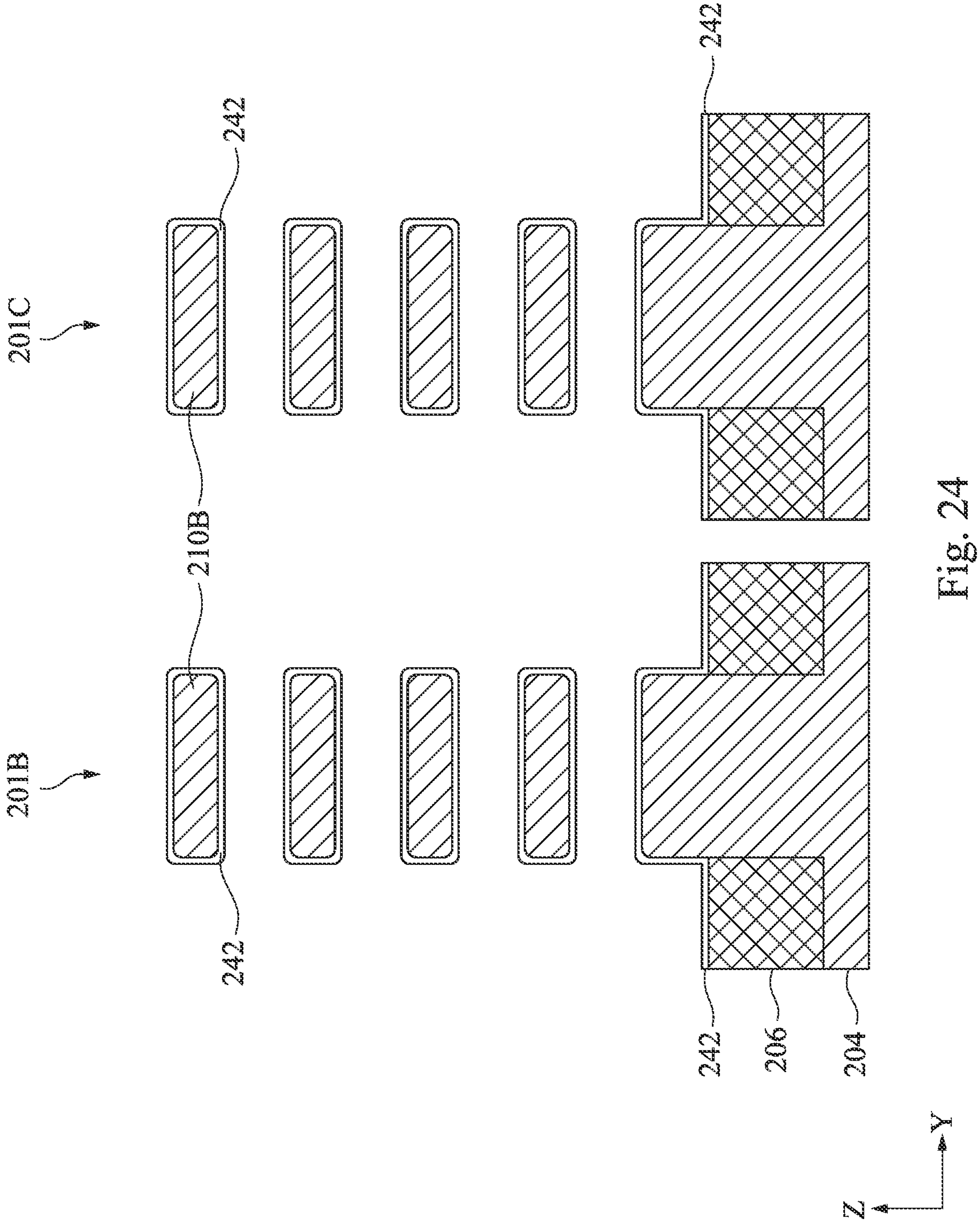

Now referring to FIGS. 1 and 24, at operation 14, interfacial layers 242 are formed around the semiconductor layers 210B of the transistors 201B and 201C. In some embodiments, the interfacial layers 242 are also formed over the substrate 204 and the isolation feature 206. A material of the interfacial layers 242 may include materials such as SiO2, SiON, HfSiO, other suitable materials, or combinations thereof. A deposition process may be performed to form the interfacial layers 242 wrapping around the suspended semiconductor layers 210B. The deposition process may include CVD, PVD, ALD, other suitable methods, or combinations thereof. In some other embodiments, the interfacial layers 242 are formed by an oxidation process. For example, in the case that the semiconductor layers 210B include silicon, the structure may be exposed to a wet oxidation process, a dry oxidation process, or a combination thereof. Thereby, a thin layer including SiO2 is formed around each of the semiconductor layers 210B and functions as a interfacial layer 242. A thickness T3 (in the Z-direction) of the interfacial layers 242 is about 6 Å to about 15 Å.

Figure 25:
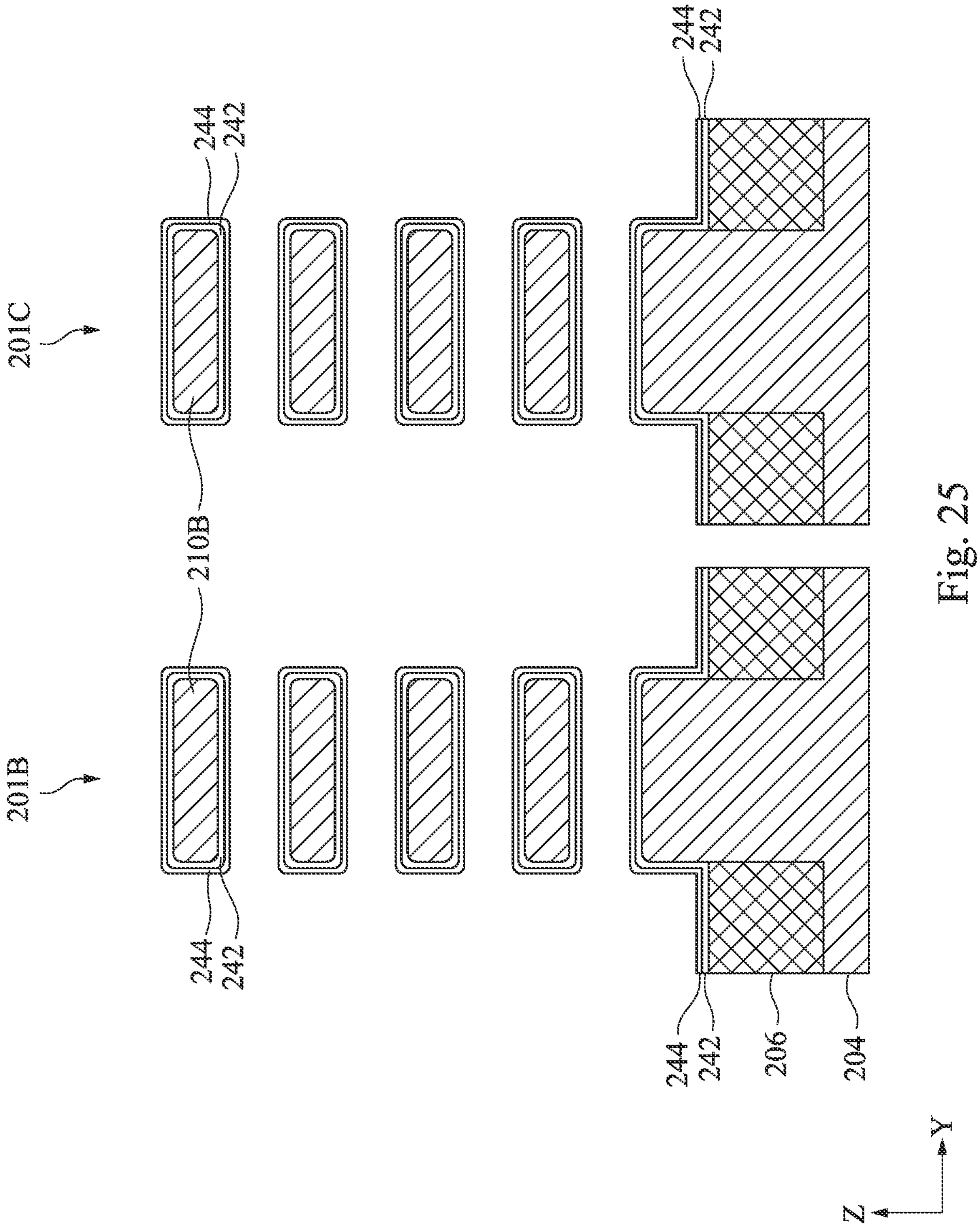

Now referring to FIGS. 1 and 25, at operation 16, first gate dielectric layers 244 are formed around the interfacial layers 242. In some embodiments, the first gate dielectric layers 244 include a high-k dielectric material. In accordance with some embodiments, the first gate dielectric layer 244 is a high-k dielectric material having a k value greater than about 7, about 9, about 11, about 13, or about 15. In some embodiments, the first gate dielectric layers 244 includes a metal oxide or a silicate of Hf, Al, Pr, Zr, La, Mg, Ba, Ti, Pb, Gd, Ho, Er, Tm, Yb, Lu, Ce, Nd, Pm, Sm, Eu, Tb, Dy and combinations thereof. In some embodiments, the first gate dielectric layer 102 comprises an oxide of a rare earth metal. In some embodiments, the first gate dielectric layer 102 comprises an oxide of an element having a bandgap greater than about 3.5 eV, about 4 eV, about eV, about 5.3 eV, about 5.5 eV, about 5.7 eV, or about 6 eV. In some embodiments, the first gate dielectric layer 102 is thermally stable up to temperature of at least about 850 C, about 900 C, about 900 C, or about 1000 C.

In some embodiments, the first gate dielectric layer 102 may comprise hafnium oxide (HfOx), AlOx, lanthanum oxide (LaOx), LaSixOy, $La_2O_3$, $Gd_2O_3$, $HoO_3$, $Er_2O_3$, $Tm_2O_3$, $Yb_2O_3$, $Lu_2O_3$, HfLaxOy, TiOx, HfZrxOy, HfSixOy, $Pr_2O_3$, ZrOx, ZrSixOy, TaOx, YOx, SrTixOy, BaTixOy (BTO), BaZrxOy, HfZrxOy, HfZrxOyNz, HfLaxOy, HfSixOy, HfSixOyNz, LaSixOy, AlSixOy, HfTaxOy, HfTixOy, (Ba,Sr)TixOy (BST), combinations thereof, or other suitable material.

The formation methods of the first gate dielectric layer 102 may include Molecular-Beam Deposition (MBD), ALD, CVD, PECVD, and the like. In other embodiments, the first gate dielectric layer 102 may be directly formed on the fins 58 if the interfacial layer 100 is not present. In some embodiments, the first gate dielectric layers 102 are deposited by ALD and/or other suitable methods. In some embodiments, a thickness of the first gate dielectric layers 244 is about 5 Å to about 50 Å, depending on the number of ALD cycles performed. For example, in some embodiments, one ALD cycle is performed. In some embodiments, 20 cycles are performed. In some embodiments, between 1 and 20 cycles are performed. Any number of ALD cycles may be performed. In some embodiments, the first dielectric layer 102 has a physical thickness of about 1 nm to about 20 nm, and is not limited.

In some embodiments, the first gate dielectric layer 244 has a leakage current density below 10-8 A/cm2 at V=±1V, at EOT=1.4 nm, and at room temperature. In some embodiments, the first gate dielectric layer 244 has a leakage current density below 10-8 A/cm2 at V=about ±0.5 V, about ±0.6 V, about ±0.7 V, about ±0.8 V, about ±0.9 V, or about ±1V, at about EOT=1.0 nm, about EOT=1.1 nm, about EOT=1.2 nm, about EOT=1.3 nm, or about EOT=1.4 nm, and at about C, about 10 C, about 20 C, or about 25 C, after being subject to a temperature of at least about 850 C, about 900 C, about 900 C, or about 1000 C for at least about 10 s, about 11 s, about 12 s, about 13 s, about 14 s, or about 15 s. In some embodiments, the first gate dielectric layer 244 is amorphous and does not crystallize and/or does not experience a phase change in response to being subject to a temperature of at least about 850 C, about 900 C, about 900 C, or about 1000 C for at least about 10 s, about 11 s, about 12 s, about 13 s, about 14 s, or about 15 s.

In some embodiments, the first gate dielectric layer 244 includes praseodymium oxide (Pr2O3). It should be noted that hafnium oxide (HfO2) has a relative high dielectric constant value (about 20 to 25), however, hafnium oxide has a leakage current density higher than that of Pr2O3. Furthermore, the hafnium oxide dielectric has poor thermal stability and faces recrystallization at temperature above 850 C. In other words, a hafnium oxide dielectric material, when used as the first gate dielectric layer 244, is crystallized during a high thermal process, so that the crystal defects generated in the hafnium oxide dielectric layer cause an increase in leakage current. In some embodiments, the Pr2O3 layer has a composition of $Pr_xO_y$, where x is between about 0.1 and about 2, and where y is between about 0.1 and about 3. In some embodiments, the $Pr_xO_y$ material has a dielectric constant greater than 13.

The first gate dielectric layer 244 may be formed by any suitable method such as, for example, CVD, ALD, PVD, HDP-CVD, MO-CVD, RP-CVD, PE-CVD, LP-CVD, AL-CVD, AP-CVD, and/or other suitable methods.

In some embodiments, the transistors formed have a voltage threshold (Vt), which is tuned or modified or controlled based on the thickness of the first gate dielectric layers 244. In addition, in some embodiments, transistor 201B has a first Vt and transistor 201C has a second Vt.

In some embodiments, a manufacturing method resulting in different transistors having different thicknesses of the first gate dielectric layers 244 is used. For example, a hard mask, as understood by those of skill in the art, may be formed over transistor 201C and may be not formed over transistor 201B. A first number x of ALD cycles may be performed so as to generate first gate dielectric layers 244 over the interfacial layer 100 of transistor 201B and over the interfacial layer 100 and the hard mask of transistor 201C. The hard mask and the first gate dielectric layers 244 may then be removed from transistor 201C. A second number y of ALD cycles may be performed so as to generate a first gate dielectric layers 244 over the interfacial layer 100 and the previously formed first gate dielectric layer 244 of transistor 201B and over the interfacial layer 100 of transistor 201B. Accordingly, the transistor 201B has a first gate dielectric layer 244B on the interfacial layer 100 having been formed with x+y ALD cycles, and the transistor 201C has a first gate dielectric layer 244C on the interfacial layer 100 having been formed with y ALD cycles. Accordingly, the transistor 201B has a different Vt than that of the transistor 201C. Other manufacturing methods may be used to achieve different threshold voltages for different transistors.

Figure 26:
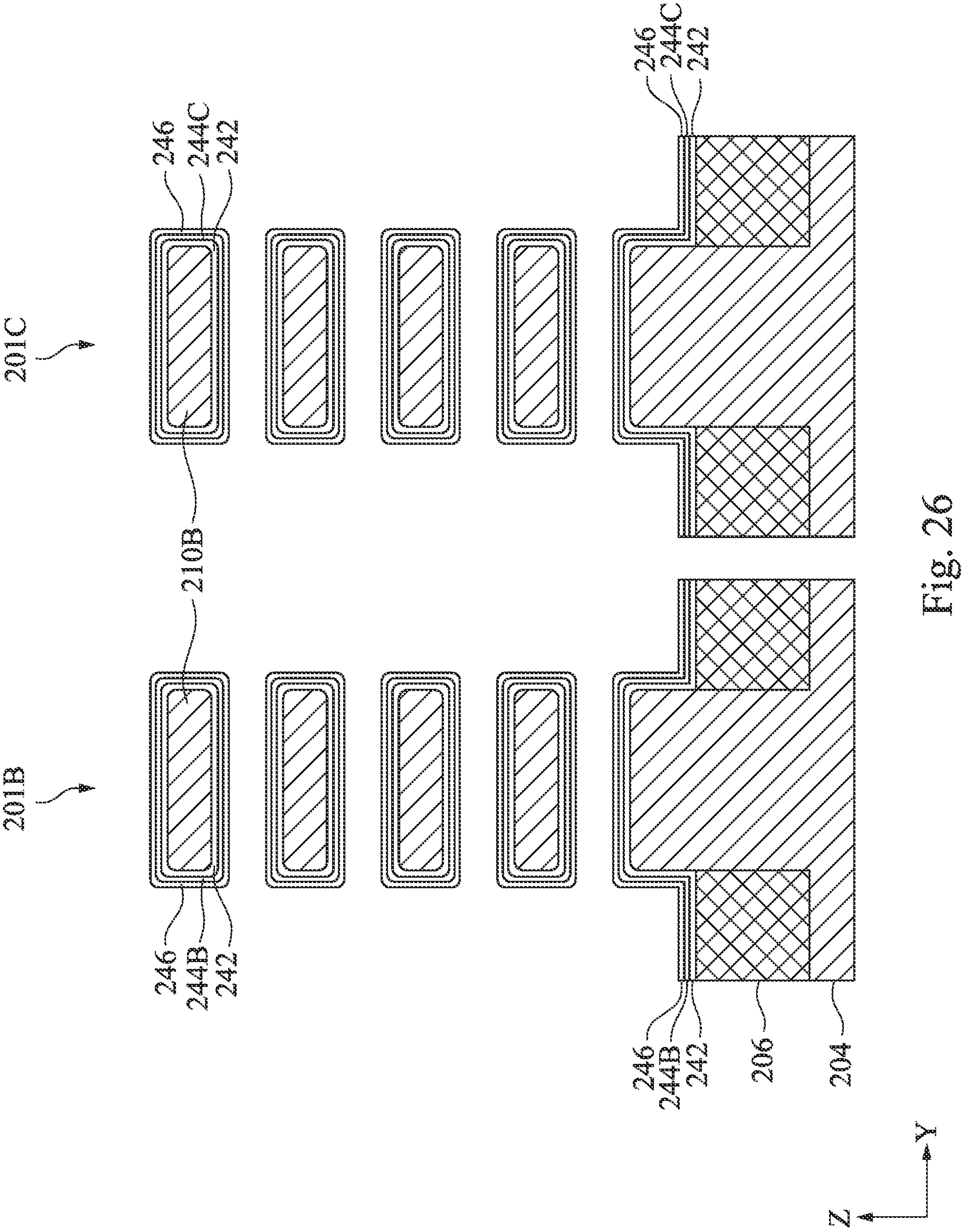

Now referring to FIGS. 1 and 26, at operation 18, a dipole layer 246 is deposited over the first gate dielectric layers 244B and 244C. The dipole layer 246 may, for example, include (Al) and oxygen (O) aluminum oxide, and form a P dipole. The dipole layer 246 may, for example, include other dipole materials or other dipole forming materials, which may form P or N dipoles. The dipole layer 246 may, for example, be formed directly on a surface of the first gate dielectric layer 244B or 244C. The dipole layer 246 may be characterized by Al—O bonds. In general, the dipole layer 246 may be an aluminum oxide layer.

In some embodiments, the aluminum oxide layer is a conformal Al2O3 layer formed directly on the first gate dielectric layer 244B or 244C. In some embodiments, the aluminum layer can be formed by coating techniques including e-beam deposition, ion assisted e-beam deposition (IAD), magnetron sputtering, ion beam deposition (IBD) and electron cyclotron resonance sputtering (ECR). Ion assisted e-beam deposition can produce a dense amorphous aluminum film. In an exemplary embodiment, a conformal aluminum oxide film can be formed by plasma-enhanced atomic layer deposition, which includes adsorbing an aluminum compound containing an Al—C bond and an Al—

O—C bond, providing an oxidizing gas and an inert gas, applying radio frequency (RF) power to the oxidizing gas and the inert gas to react the adsorbed aluminum compound to form a conformal film of aluminum oxide on the first high-k dielectric layer. In an embodiment, the dipole layer 246 has a physical thickness of about 0.1 nm to about 1.0 nm, and is not limited.

In some embodiments, an annealing (i.e., a heat treatment) process is performed after the formation of the dipole layer 246 to diffuse, for example, aluminum atoms into the first gate dielectric layers 244B and/or 244C to form dipole elements. The annealing process may be performed at a temperature of from about 500° C. to about 1200° C. or from about 550° C. to about 1050° C. The annealing process can be performed for a duration in a range of several seconds (e.g., 5 seconds) to several minutes (e.g., 20 minutes). In some embodiments, the annealing temperature is from about 800 C to about 1100 C, and the annealing time duration is about 10 seconds to 10 minutes without having performance degradation of the first gate dielectric layer. In some embodiments, the annealing time may depend on the annealing temperature. It should be appreciated that other annealing processes may be performed at other temperatures and for other time periods.

In some embodiments, during the annealing process, some of the dipole inducing element of the dipole layer 246 is driven through the first gate dielectric layers 244B and/or 244C such that the dipole-inducing element is formed at the interfaces of the first gate dielectric layers 244B and/or 244C and interface layer 242. The dipole inducing element creates dipole interfaces between the interface layer 242 and first gate dielectric layers 244B and/or 244C, which may modulate the effective work function of subsequently formed metal gates.

After the annealing process, excess portions of the dipole layer 246 may be removed. The removal may be accomplished, for example, by etching the dipole layer 246 with, for example, a hydrogen peroxide mixture. In some embodiments, after the etching, a sacrificial layer is formed on the first gate dielectric layers 244B and/or 244C. The sacrificial layer is a sacrificial layer that will be removed in subsequent processing. Although the etching process is performed to remove the dipole layer 246, some residual portions of the dipole layer 246 may remain even after the removal etching process. In particular, some particles (e.g., residues or atoms) of the dipole-inducing element may remain on top surfaces of the first gate dielectric layers 244B and/or 244C. The material of the sacrificial layer is a material that reacts (e.g., bonds to or interacts) with the dipole-inducing element. The sacrificial layer may, for example, be formed from TiAl, TiN, TiAlN, silicon-doped TiN (TiSiN), TaN, or another material that bonds to or interacts with the dipole-inducing elements, and may be formed by a deposition process such as ALD or CVD. In an embodiment, the sacrificial layer is formed to a thickness of from about 10 A to about 30 A.

If used, the sacrificial layer may be removed with an acceptable etching process. In an embodiment, the sacrificial layer is removed with a wet etching process using an Ammonium-Hydroxide Peroxide Mixture (APM). The APM may include NH4OH, H2O2 and H2O, respectively, at ratios of from about 1:1:3 to about 1:1:100. The amount of H2O may depend on the temperature of the wet etch. The wet etch may be performed at a temperature of from about 30° C. to about 80° C., and may be performed for a time period of from about 10 seconds to about 500 seconds. It should be appreciated that other etch process parameters (e.g., etchants, ratios, temperatures, and/or time periods) may be used. At least some of the residual particles of the dipole inducing element are removed with the sacrificial layer.

In other embodiments, the heat treatment is performed after the formation of subsequent steps. In some embodiments, the annealing (heat treatment) process can be performed at a temperature ranging from about 500 C to about 1200 C. The annealing process can be performed for a duration in a range of several seconds (e.g., 5 seconds) to several minutes (e.g., 20 minutes). In some embodiments, the annealing temperature is from about 800 C to about 1100 C, and the annealing time duration is about 10 seconds to 10 minutes without having performance degradation of the first gate dielectric layer 244B or 244C. The annealing process drives some or all aluminum atoms into the first gate dielectric layer 244B or 244C which forms dipoles, which can be used to control the threshold voltage of a subsequently formed semiconductor device.

In some embodiments, annealing is not performed, and the dipole layer 246 substantially remains on the first gate dielectric layer. In some embodiments, annealing is performed, and the dipole layer 246 substantially remains on the first gate dielectric layer despite the annealing process. For example, the dipole layer 246 may substantially remain on a first gate dielectric layer 244B or 244C comprising Pr2O3. Accordingly, the threshold voltage of the transistor is controlled or dominated or affected by the thickness of the first gate dielectric layer 244B or 244C.

Figure 27:
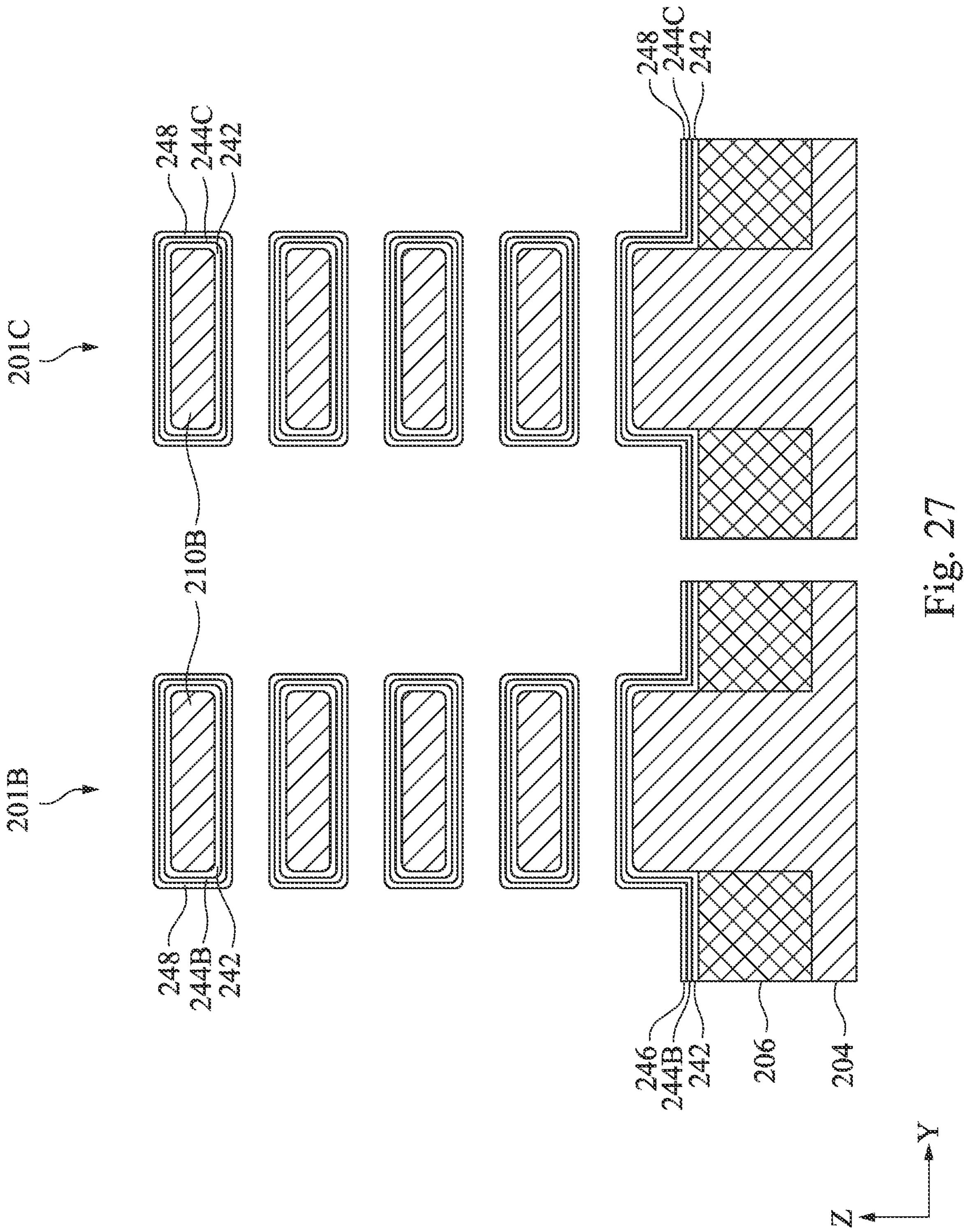

Now referring to FIGS. 1 and 27, at operation 20, a second dielectric layer 248 is formed on the first gate dielectric layers 244B and 244C. In some embodiments, the second dielectric layer 248 includes one or more oxides of a metal (e.g., hafnium, zirconium, praseodymium) or a metal compound (e.g., praseodymium and hafnium). The second dielectric layer 106 may include any of the materials which may be used for the first dielectric layer 102. For example, in some embodiments, the second dielectric layer 248 includes one or more oxides selected from the group consisting of HfO2, ZrO2, Pr2O3, Pr2xHf2(1-x)$O_y$, where $0 \leq x \leq 1$, and $0 < y \leq 3$. In some embodiments, other high-k dielectric materials are used. The second dielectric layer 248 can be formed by deposition over the dipole layers 246. The second dielectric layer 248 can be deposited by chemical vapor deposition (CVD), physical vapor deposition (PVD), molecular beam deposition (MBD), pulsed laser deposition (PLD), atomic layer deposition (ALD), and the like. In an embodiment, the second dielectric layer 106 has a physical thickness of about 1 nm to about 20 nm, and is not limited.

Figure 28:
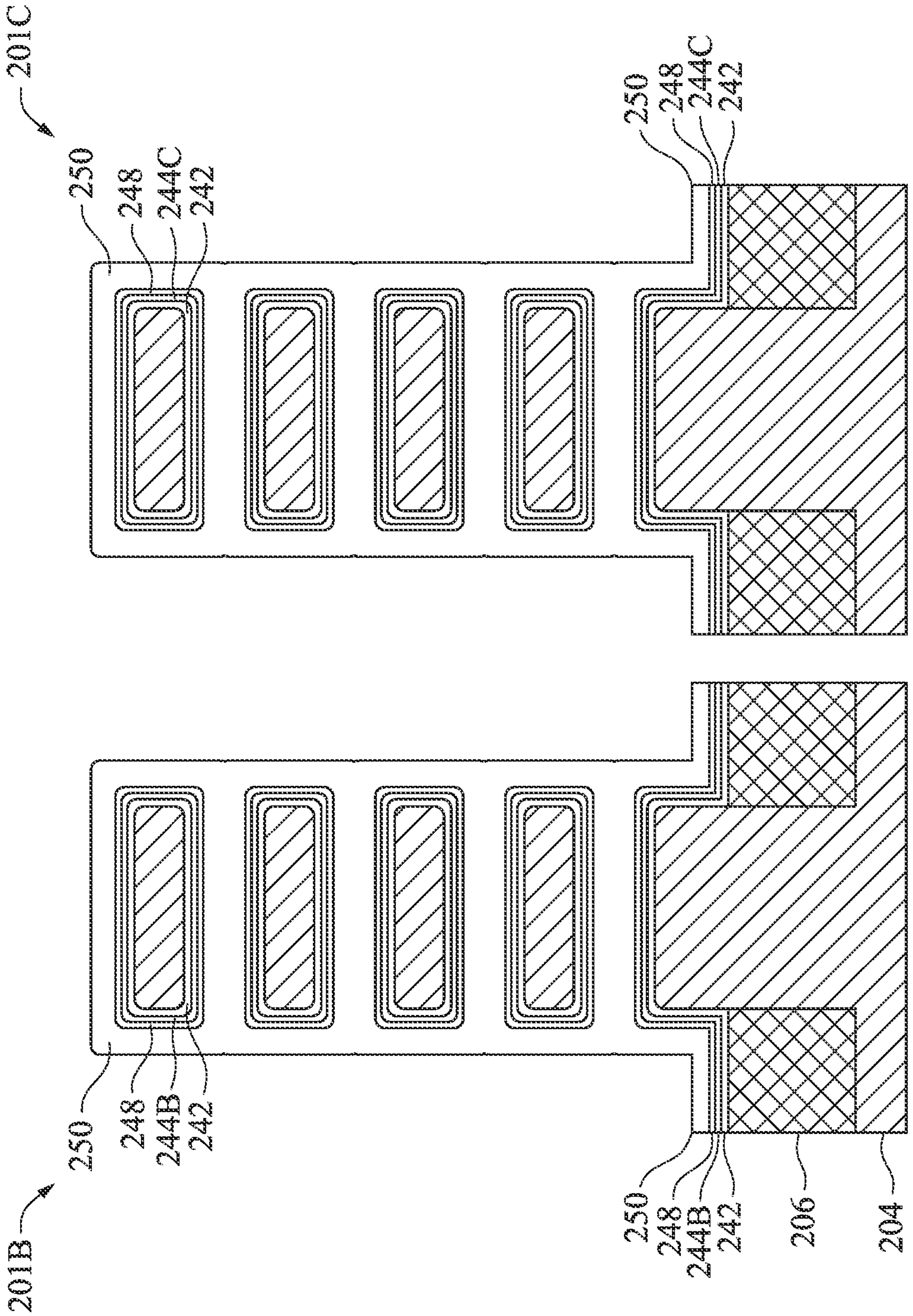

Now referring to FIGS. 1 and 28, at operation 22, one or more conductive work function layers 250 are deposited over the second dielectric layer 248. One or more conductive work function layers 248 are chosen to tune the work function value of the transistor devices so that a desired threshold voltage Vt can be achieved in the transistors that is formed. Examples of materials for the one or more conductive work function layers 250 for a gate structure for n-type transistor devices include Ti, Ag, TaAl, TaAlC, TiAlN, TaC, TaCN, TaSiN, Mn, Zr, other suitable work function materials, or combinations thereof. Examples of materials for the one or more conductive work function layers 250 for p-type transistor devices include TiN, TaN, Ru, Mo, Al, WN, ZrSi2, MoSi2, TaSi2, NiSi2, other suitable work function materials, or combinations thereof.

Each of the one or more conductive work function layers 250 may have a thickness selected so that a desired threshold voltage Vt can be achieved in the transistors that are formed. For example, the thickness of each of the one or more conductive work function layers 250 may have a thickness in a range from about 2.5 angstroms to about 30 angstroms. For example, the one or more conductive work function layers 250 may have a combined thickness of less than about 2.5 A. In some embodiments, the one or more conductive work function layers 250 have a combined thickness of about 2.5 A, about 5 A, about 7.5 A, about 10 A, about 12.5 A, about 15 A, about 17.5 A, about 20 A, about 22.5 A, about 25 A, about 27.5 A, or about 30 A. In some embodiments, the one or more conductive work function layers 248 may have a combined thickness of greater than about 30 A.

Figure 29:
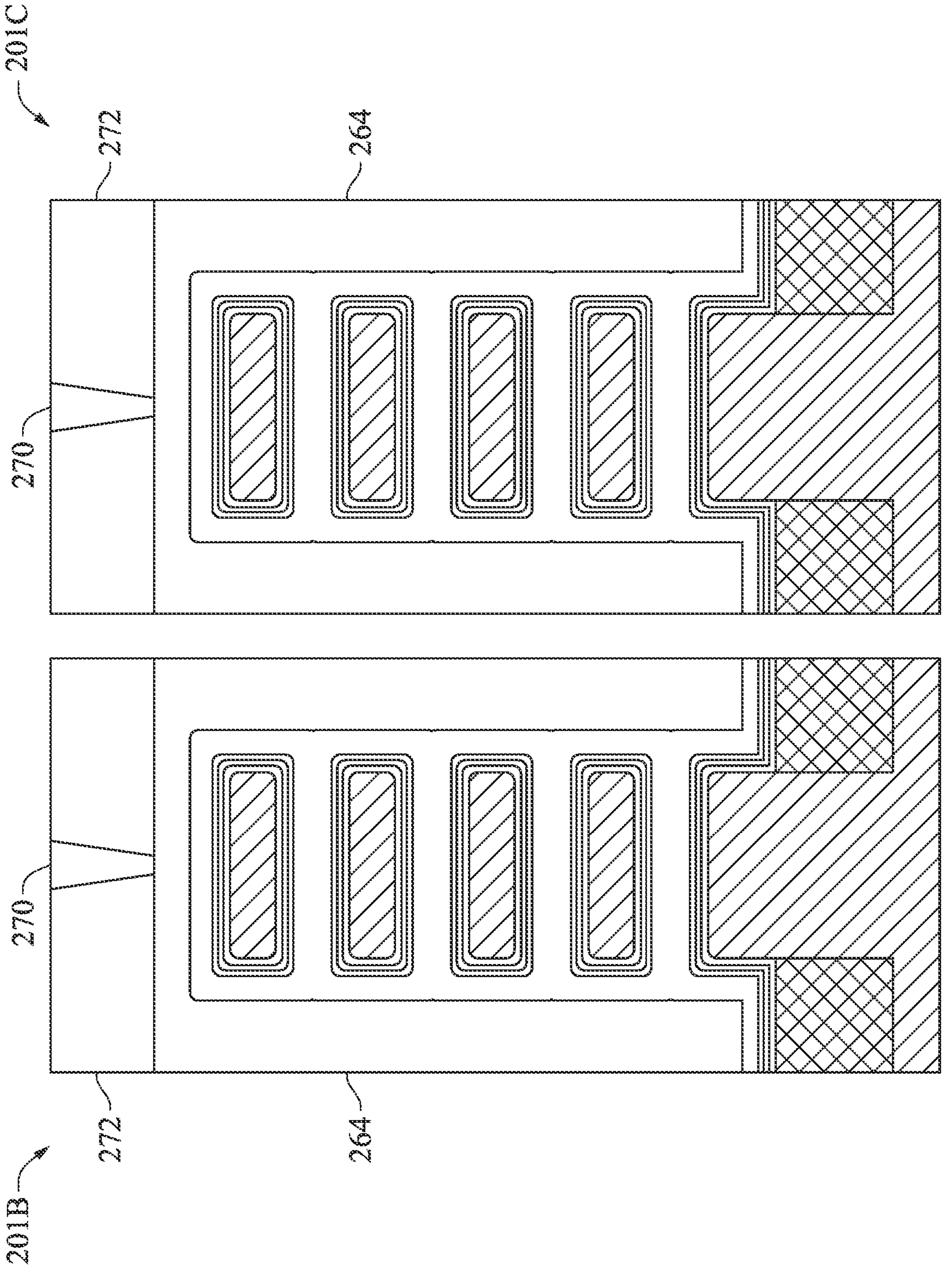

Now referring to FIGS. 1 and 29, at operation 24, a fill metal layer 264 is deposited over the conductive work function layer 250. In certain embodiments, the fill metal layer 264 may comprise Titanium, TiN, Tantalum, TaN, TaC, tungsten, cobalt, aluminum, ruthenium, copper, other suitable metals, multi-layers thereof, a combination thereof, multiple layers thereof, or the like. The fill metal layer 264 may be deposited by a suitable process, such as CVD, physical vapor deposition (PVD), sputtering, ALD, PECVD, plating, or other deposition processes.

In some embodiments, a glue metal layer (not shown) may be deposited, for example, by ALD, CVD, PVD, and/or other suitable process, on the conductive work function layer 250, and the fill metal layer 264 is deposited on the glue layer. The glue layer may use materials that promote or enhance adhesion to the fill metal layer 264, which is to be formed on the glue layer. In some embodiments, the glue layer may also provide a desired work function and adjust Vt of the transistor.

In some embodiments, a first glue layer for p-type FinFETs comprises a p-type work function metal layer, and a second glue layer for n-type FinFETs comprises an n-type work function metal layer. In some embodiments, a same glue layer is used for both p-type and n-type FinFETs. In some embodiments, only one of p-type and n-type FinFETs use a glue layer.

In an embodiment, the glue layer has a relatively small thickness (e.g., less than 3 nm, or about 2 nm to about 3 nm) over the fins in order to achieve a designed work function for the FinFET. In some embodiments, the glue layer may be thicker on one of p-type and n-type FinFETs, and thinner on the other of p-type and n-type FinFETs.

The choice of metal and thickness to be used in the glue layer may be determined or influenced by an overall threshold voltage desired for the FinFET device being formed.

Referring to FIGS. 1 and 29, at operation 26, method 10 performs further processing to complete the fabrication of the transistors. For example, at operation 24, method 10 may also form various contacts/vias 270, metal lines, as well as other multilayer interconnect features such as ILD layers 272 and interconnect layers, configured to connect the various features to form a functional circuit that may include the semiconductor devices.

According to some embodiments, a method of forming a semiconductor device includes forming a first transistor comprising a first gate stack in a first region of a semiconductor substrate by, at least, forming an interfacial layer on the semiconductor substrate, forming a first dielectric layer having a first thickness on the interfacial layer, forming a first dipole layer on the first dielectric layer, forming a second dielectric layer on the first dipole layer, and forming a first conductive work function layer on the second dielectric layer. The method also includes forming a second transistor comprising a second gate stack in a second region of a semiconductor substrate by, at least, forming a third dielectric layer having a second thickness on the interfacial layer, forming a second dipole layer on the third dielectric layer, annealing to drive dipole inducing elements from the second dipole layer into the third dielectric layer to the interfacial layer, removing residual second dipole layer, forming a fourth dielectric layer on the third dielectric layer, and forming a second conductive work function layer on the fourth dielectric layer. The method also includes forming a gate electrode layer over the first conductive work function layer and second conductive work function layer. The thickness of the first dielectric layer is less than a thickness of the third dielectric layer. The first transistor is characterized by a first threshold voltage determined by dipole inducing elements in the first dipole layer on the first dielectric layer, and the second transistor is characterized by a second threshold voltage determined by dipole inducing elements on the interfacial layer.

According to some embodiments, a method of forming a semiconductor device includes forming a transistor comprising a gate stack on a semiconductor substrate by, at least, forming a first dielectric layer on the semiconductor substrate, forming a dipole layer on the dielectric layer; forming a second dielectric layer on the dipole layer, forming a conductive work function layer on the second dielectric layer, forming a gate electrode layer on the conductive work function layer. The method also includes varying a distance between dipole inducing elements in the dipole layer and a surface of the semiconductor substrate by tuning a thickness of the first dielectric layer to adjust a threshold voltage of the transistor.

According to some embodiments, a semiconductor device includes a first transistor comprising a first gate stack in a first region of a semiconductor substrate. The first transistor includes a first dielectric layer having a first thickness on the semiconductor substrate, the first dielectric layer, a first dipole layer on the first dielectric layer, a second dielectric layer on the first dipole layer, a conductive work function layer on the second dielectric layer, and a gate electrode layer over the conductive work function layer. The first transistor is characterized by a first threshold voltage determined by a distance between dipole inducing elements in the first dipole layer on the first dielectric layer and a surface of the semiconductor substrate.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a first transistor comprising a first gate stack in a first region of a silicon substrate, the first transistor comprising:

a first gate dielectric layer on the silicon substrate, the first gate dielectric layer having a first thickness, comprising praseodymium oxide, and being substantially amorphous, wherein the first gate dielectric layer has a physical thickness of 1 nm to 20 nm, has a dielectric constant value in a range of 25 to 32 and an amorphous structure stable up to 1000° C. for 15 s;

a first dipole layer residue on the first gate dielectric layer, the first dipole layer residue remaining following an annealing process on a first dipole layer;

a second gate dielectric layer on the first dipole layer residue;

a conductive work function layer on the second gate dielectric layer; and a gate electrode layer over the conductive work function layer; and wherein the first transistor is characterized by a first threshold voltage determined by a distance between dipole inducing elements in the first dipole layer on the first gate dielectric layer and a surface of the silicon substrate.

2. The semiconductor device of claim 1, wherein the second gate dielectric layer comprises praseodymium oxide.

3. The semiconductor device of claim 1, further comprising:

a second transistor comprising a second gate stack in a second region of the silicon substrate, the second transistor comprising:

a third gate dielectric layer on the silicon substrate, the third gate dielectric layer having a second thickness, the third gate dielectric layer including dipole inducing elements and comprising praseodymium oxide;

a fourth gate dielectric layer on the third gate dielectric layer;

the conductive work function layer on the fourth gate dielectric layer; and the gate electrode layer over the conductive work function layer;

wherein a thickness of the first gate dielectric layer is less than a thickness of the third gate dielectric layer; and wherein the second transistor is characterized by a second threshold voltage determined by dipole inducing elements in the third gate dielectric layer.

4. The semiconductor device of claim 3, wherein the first transistor is characterized by a first EOT and the second transistor is characterized by a second EOT, and the first EOT is less than or equal to the second EOT.

5. The semiconductor device of claim 3, wherein the dipole inducing elements in the third gate dielectric layer are derived from a second dipole layer, which is deposited on the third gate dielectric layer and subsequently removed following the annealing process to drive the dipole inducing elements into the third gate dielectric layer.

6. A semiconductor device, comprising:

a transistor comprising a gate stack on a silicon substrate by at least:

a first gate dielectric layer on the silicon substrate, the first gate dielectric layer comprising praseodymium oxide and being substantially amorphous, wherein the first gate dielectric layer has a physical thickness of 1 nm to 20 nm, has a dielectric constant value in a range of 25 to 32 and an amorphous structure stable up to 1000° C. for 15 s;

a dipole layer residue on the first gate dielectric layer, the dipole layer residue remaining following an annealing process on a dipole layer;

a second gate dielectric layer on the dipole layer residue;

a conductive work function layer on the second gate dielectric layer; and a gate electrode layer on the conductive work function layer; and wherein a distance between dipole inducing elements in the dipole layer and a surface of the silicon substrate is varied by tuning a thickness of the first gate dielectric layer to adjust a threshold voltage of the transistor.

7. The semiconductor device of claim 6, wherein the second gate dielectric layer comprises praseodymium oxide.

8. The semiconductor device of claim 6, wherein the first gate dielectric layer comprises an oxide or nitride of a rare earth metal having a bandgap energy of greater than 5.3 eV.

9. The semiconductor device of claim 6, wherein the transistor is characterized by a threshold voltage determined at least partly by a distance between dipole inducing elements in the dipole layer on the first gate dielectric layer and a surface of the silicon substrate.

10. A semiconductor structure, comprising:

a silicon substrate comprising a first region and a second region;

a first transistor disposed in the first region, wherein the first transistor comprises a first gate stack comprising:

a first portion of an interfacial layer disposed on the silicon substrate in the first region;

a first gate dielectric layer disposed on the first portion of the interfacial layer and having a first thickness, the first gate dielectric layer comprising praseodymium oxide and being substantially amorphous, wherein the first gate dielectric layer has a physical thickness of 1 nm to 20 nm, has a dielectric constant value in a range of 25 to 32 and an amorphous structure stable up to 1000° C. for 15 s;

a first portion of a dipole layer residue disposed on the first gate dielectric layer, the first portion of the dipole layer residue remaining following an annealing process on a dipole layer;

a first portion of a second gate dielectric layer disposed on the first portion of the dipole layer residue; and a first portion of a conductive work function layer disposed on the first portion of the second gate dielectric layer; and a second transistor disposed in the second region, wherein the second transistor comprises a second gate stack comprising:

a second portion of the interfacial layer disposed on the silicon substrate in the second region;

a third gate dielectric layer disposed on the second portion of the interfacial layer and having a second thickness, wherein the second thickness is larger than the first thickness, the third gate dielectric layer comprising praseodymium oxide and being substantially amorphous;

a second portion of the dipole layer residue disposed on the first gate dielectric layer, the second portion of the dipole layer residue remaining following the annealing process on the dipole layer;

a second portion of the second gate dielectric layer disposed on the second portion of the dipole layer residue; and a second portion of the conductive work function layer disposed on the second portion of the second gate dielectric layer; and wherein a first distance between dipole inducing elements in the first portion of the dipole layer and a bottom surface of the first portion of the interfacial layer is varied, by tuning the first thickness, to adjust a first threshold voltage of the first transistor, and wherein a second distance between dipole inducing elements in the second portion of the dipole layer and a bottom surface of the second portion of the interfacial layer is varied, by tuning the second thickness, to adjust a second threshold voltage of the second transistor.

11. The semiconductor structure of claim 10, wherein the first transistor is characterized by a first EOT, and the second transistor is characterized by a second EOT, and wherein the first EOT is less than or equal to the second EOT.

12. The semiconductor structure of claim 10, wherein the second gate dielectric layer comprises praseodymium oxide.

13. The semiconductor structure of claim 10, wherein the second gate dielectric layer comprises hafnium oxide.

14. The semiconductor structure of claim 10, wherein the first portion of the interfacial layer and the second portion of the interfacial layer are formed simultaneously;

the first portion of the dipole layer residue and the second portion of the dipole layer residue are formed simultaneously; and the first portion of the second gate dielectric layer and the second portion of the second gate dielectric layer are formed simultaneously.

15. The semiconductor structure of claim 10, wherein the first gate dielectric layer is formed by performing a first number of atomic layer deposition (ALD) cycles; and the third gate dielectric layer is formed by performing the first number of ALD cycles, simultaneously while forming the first gate dielectric layer, followed by performing additional ALD cycles.

16. The semiconductor device of claim 1, wherein the second gate dielectric layer comprises hafnium oxide.

17. The semiconductor device of claim 6, wherein the second gate dielectric layer comprises hafnium oxide.

18. The semiconductor device of claim 1, wherein the first gate dielectric layer comprises a material which, in response to a 1 V potential, experiences a leakage current density less than 10-8 A/cm2, when having an equivalent oxide thickness (EOT) of 1.4 nm after being exposed to a temperature of about 1000° C. for about 15 s.

19. The semiconductor device of claim 6, wherein the conductive work function layer comprises titanium nitride, tantalum nitride, ruthenium, molybdenum, aluminum, tungsten nitride, $ZrSi_2$, $MoSi_2$, $TaSi_2$, or $NiSi_2$.

20. The semiconductor structure of claim 10, wherein the annealing process is performed at a temperature ranging from about 800° C. to about 1100° C.

* * * * *